United States Patent
Dai et al.

(10) Patent No.: US 12,193,311 B2
(45) Date of Patent: Jan. 7, 2025

(54) DISPLAY PANEL AND DISPLAY APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Junxiu Dai, Beijing (CN); Tingliang Liu, Beijing (CN); Yang Zhou, Beijing (CN); Xin Zhang, Beijing (CN); Yi Qu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/577,055

(22) PCT Filed: Jul. 23, 2021

(86) PCT No.: PCT/CN2021/108101
§ 371 (c)(1),
(2) Date: Jan. 5, 2024

(87) PCT Pub. No.: WO2023/000295
PCT Pub. Date: Jan. 26, 2023

(65) Prior Publication Data
US 2024/0244929 A1    Jul. 18, 2024

(51) Int. Cl.
*G06F 3/041*    (2006.01)
*G09G 3/00*    (2006.01)
(Continued)

(52) U.S. Cl.
CPC ......... *H10K 59/873* (2023.02); *G06F 3/0412* (2013.01); *H10K 59/131* (2023.02); *H10K 59/40* (2023.02); *G09G 3/006* (2013.01)

(58) Field of Classification Search
CPC .... H10K 59/873; H10K 59/131; H10K 59/40; H10K 59/65; H10K 59/88; H10K 71/70; G06F 3/0412; G09G 3/006
See application file for complete search history.

(56) References Cited

U.S. PATENT DOCUMENTS

2016/0299610 A1    10/2016  Yoon
2020/0161406 A1    5/2020   Lee et al.
(Continued)

FOREIGN PATENT DOCUMENTS

CN    110620103 A    12/2019
CN    110727373 A    1/2020
(Continued)

OTHER PUBLICATIONS

International Search Report and Written Opinion received for PCT Patent Application No. PCT/CN2021/108101, mailed on Mar. 1, 2022, 16 pages (8 pages of English Translation and 8 pages of Original Document).

*Primary Examiner* — Antonio Xavier
(74) *Attorney, Agent, or Firm* — ArentFox Schiff LLP; Michael Fainberg

(57) ABSTRACT

A display panel includes a display area surrounding a through hole and an isolation area between the through hole and the display area. The isolation area includes at least two annular blocking dams surrounding the through hole. A first metal layer, an insulating layer and a second metal layer are arranged in a gap between the adjacent annular blocking dams. The isolation area further includes a through hole crack detection line wound around the edge of the through hole. The through hole crack detection line includes a first detection line and a second detection line. The first detection line on the same layer as the first metal layer and the second detection line on the same layer as the second metal layer are (Continued)

electrically connected through a via hole of the insulating layer.

20 Claims, 14 Drawing Sheets

(51) Int. Cl.
*H10K 59/131* (2023.01)
*H10K 59/40* (2023.01)
*H10K 59/80* (2023.01)

(56) References Cited

U.S. PATENT DOCUMENTS

| | | | |
|---|---|---|---|
| 2020/0175901 A1* | 6/2020 | Lee | G09G 3/006 |
| 2020/0176709 A1 | 6/2020 | Moon et al. | |
| 2020/0212159 A1 | 7/2020 | Lee | |
| 2022/0129098 A1 | 4/2022 | Hu et al. | |
| 2022/0130937 A1 | 4/2022 | Zhao et al. | |
| 2022/0246880 A1* | 8/2022 | Jeong | G06F 1/1637 |
| 2024/0231524 A1* | 7/2024 | Choi | G06F 3/0448 |

FOREIGN PATENT DOCUMENTS

| | | |
|---|---|---|
| CN | 110931541 A | 3/2020 |
| CN | 111128064 A | 5/2020 |
| CN | 111261045 A | 6/2020 |
| CN | 111261797 A | 6/2020 |
| CN | 111384108 A | 7/2020 |
| CN | 111627366 A | 9/2020 |
| CN | 112256150 A | 1/2021 |
| CN | 112349867 A | 2/2021 |
| EP | 3699897 A1 | 8/2020 |
| KR | 10-2020-0057139 A | 5/2020 |

* cited by examiner

DISPLAY PANEL AND DISPLAY APPARATUS

CROSS-REFERENCE TO RELATED APPLICATIONS

The present application is a National Stage of International Application No. PCT/CN2021/108101, filed Jul. 23, 2021, the entire content of which is hereby incorporated by reference.

TECHNICAL FIELD

The present disclosure relates to the technical field of display, in particular to a display panel and a display apparatus.

BACKGROUND

In recent years, display products with under-screen cameras emerge in endlessly. The under-screen camera may further increase a screen-to-body ratio and provide users with a better using experience. A hole design on a display screen is required for the under-screen camera. For a screen with a hole, cracks may occur at an edge of the hole, and crack detection needs to be performed on the edge of the hole.

In a current detection mode, a circle of crack detection line is arranged at the edge of the hole, and whether there are cracks is determined by detecting relevant electrical parameters of the crack detection line. However, there is usually a residual metal layer at the edge of the hole, and the residual metal layer may cause a problem of failure in crack detection.

SUMMARY

A first aspect of embodiments of the present disclosure provides a display panel, including:
  a display area, used for image displaying, and surrounding at least one through hole; and
  an isolation area, located between the through hole and the display area surrounding the through hole.
The isolation area includes:
  at least two annular blocking dams, wherein the annular blocking dams surround the through hole, and the annular blocking dams are nested; and a first metal layer, an insulating layer, and a second metal layer are arranged in a gap between the adjacent annular blocking dams, and the insulating layer is located between the first metal layer and the second metal layer; and
  a through hole crack detection line, wound around an edge of the through hole, and configured to perform crack detection on the edge of the through hole, wherein the through hole crack detection line includes a first detection line and a second detection line, the first detection line and the first metal layer are arranged on the same layer and are electrically connected to each other, the second detection line and the second metal layer are arranged on the same layer and are electrically connected to each other, and the first detection line and the second detection line are electrically connected, by means of a via hole of the insulating layer, to each other at a set position.

In some embodiments of the present disclosure, the through hole crack detection line includes an input line portion, a winding line portion, and an output line portion.

The at least two annular blocking dams include a first blocking dam close to the through hole and a second blocking dam located between the first blocking dam and the display area.

The input line portion and the output line portion extend from the display area to a side of the first blocking dam close to the through hole.

One end of the winding line portion is connected with the input line portion, and the other end of the winding line portion is connected with the output line portion; and the winding line portion is arranged around the through hole by starting from a position connected with the input line portion and ending at a position connected with the output line portion.

In some embodiments of the present disclosure, the input line portion and the output line portion are located at the same end of the through hole, the input line portion and the output line portion are spaced at a set distance, and the winding line portion extends one circle around the through hole.

In some embodiments of the present disclosure, the input line portion and the output line portion are located at the same end of the through hole, the input line portion and the output line portion are spaced at a set distance, an end where the input line portion and the output line portion are located is a first end of the through hole, and an end opposite to the first end is a second end of the through hole.

The winding line portion includes a first sub portion, a second sub portion and a third sub portion; the first sub portion, the second sub portion and the third sub portion are sequentially connected, and the first sub portion, the second sub portion and the third sub portion do not intersect with each other.

The first sub portion extends half a circle around the through hole by starting from a position connected with the input line portion and ending at the second end; the third sub portion extends half a circle around the through hole by starting from a position connected with the output line portion and ending at the second end; and the second sub portion extends one circle around the through hole by starting from a position connected with the first sub portion and ending at a position connected with the third sub portion.

In some embodiments of the present disclosure, the first detection line includes an input line portion and a winding line portion, and the second detection line includes an output line portion.

The winding line portion is connected with the output line portion through the via hole of the insulating layer.

In some embodiments of the present disclosure, the first detection line includes an input line portion, and the second detection line includes a winding line portion and an output line portion.

The winding line portion is connected with the input line portion through the via hole of the insulating layer.

In some embodiments of the present disclosure, a thickness of the first metal layer is less than a thickness of the second metal layer; and the winding line portion and the first metal layer are arranged on the same layer.

In some embodiments of the present disclosure, the first detection line includes an input line portion and a first winding line portion, the second detection line includes an output line portion and a second winding line portion, and the first winding line portion and the second winding line portion constitute the winding line portion.

One end of the first winding line portion is connected with the input line portion, the other end of the first winding line portion is connected with one end of the second winding line portion through the via hole of the insulating layer, and the other end of the second winding line portion is connected with the output line portion.

In some embodiments of the present disclosure, the first winding line portion includes a first wiring portion and a first connecting portion; and the second winding line portion includes a second wiring portion and a second connecting portion.

The first wiring portion and the second wiring portion are located on one side of the first blocking dam close to the through hole, and are arranged around the through hole.

The first connecting portion and the second connecting portion extend to the display area from one side of the first blocking dam close to the through hole.

One end of the first connecting portion is connected with the first wiring portion, the other end of the first connecting portion is connected with one end of the second connecting portion through the via hole of the insulating layer, and the other end of the second connecting portion is connected with the second wiring portion.

An orthographic projection of the first connecting portion in the display area and an orthographic projection of the second connecting portion in the display area have an overlapping area.

In some embodiments of the present disclosure, the first detection line includes an input line portion and a first winding line portion, and the second detection line includes an output line portion and a second winding line portion.

The input line portion and the output line portion extend from the display area to one side of the first blocking dam close to the through hole.

One end of the first winding line portion is connected with the input line portion, and the other end of the first winding line portion is connected with the output line portion through the via hole of the insulating layer; and the first winding line portion is arranged around the through hole by starting from a position connected with the input line portion and ending at a position connected with the output line portion.

One end of the second winding line portion is connected with the input line portion through the via hole of the insulating layer, and the other end of the second winding line portion is connected with the output line portion; and the second winding line portion is arranged around the through hole by starting from a position connected with the input line portion and ending at a position connected with the output line portion.

In some embodiments of the present disclosure, the display panel includes:
a base substrate;
a driving circuit layer, located on the base substrate;
a light-emitting device layer, located on one side of the driving circuit layer facing away from the base substrate;
an encapsulation layer, located on one side of the light-emitting device layer facing away from the base substrate; and
a touch control functional layer, located on one side of the encapsulation layer facing away from the light-emitting device layer.

The touch control functional layer includes:
a touch control blocking layer, located on a surface of one side of the encapsulation layer facing away from the light-emitting device layer;
a first touch control electrode layer, located on a surface of one side of the touch control blocking layer facing away from the encapsulation layer;
a touch control insulating layer, at least partially located on a surface of one side of the first touch control electrode layer facing away from the touch control blocking layer;
a second touch control electrode layer, at least partially located on a surface of one side of the touch control insulating layer facing away from the first touch control electrode layer; and
a protection layer, at least partially located on a surface of one side of the second touch control electrode layer facing away from the touch control insulating layer.

The first metal layer and the first touch control electrode layer are arranged on the same layer, the second metal layer and the second touch control electrode layer are arranged on the same layer, and the insulating layer and the touch control insulating layer are arranged on the same layer.

In some embodiments of the present disclosure, the driving circuit layer includes:
a buffer layer, located on the base substrate;
an active layer, located on one side of the buffer layer facing away from the base substrate;
a gate insulating layer, located on one side of the active layer facing away from the buffer layer;
a gate metal layer, located on one side of the gate insulating layer facing away from the active layer;
an interlayer insulating layer, located on one side of the gate metal layer facing away from the gate insulating layer;
a source-drain metal layer, located on one side of the interlayer insulating layer facing away from the gate metal layer; and
a planarization layer, located on one side of the source-drain metal layer facing away from the interlayer insulating layer.

The light-emitting device layer includes:
a first electrode layer, located on one side of the planarization layer facing away from the source-drain metal layer, and including a plurality of mutually discrete first electrodes;
a pixel defining layer, located on one side of the planarization layer facing away from the source-drain metal layer, and at least partially located at a spacing position between the first electrodes;
a supporting portion, located on one side of the pixel defining layer facing away from the planarization layer;
a light-emitting layer, located on the sides of the first electrodes facing away from the planarization layer; and
a second electrode layer, located on the sides of the light-emitting layer, the pixel defining layer and the supporting portion facing away from the planarization layer.

The annular blocking dams have at least one stacked film layer, and the film layers included by the annular blocking dams are arranged on the same layer as at least one of the planarization layer, the pixel defining layer, and the supporting portion.

In some embodiments of the present disclosure, the display panel further includes a peripheral area surrounding the display area, wherein the peripheral area includes:
crack detection pins, located within the peripheral area on one side of the display area; and
a peripheral crack detection line, arranged around an edge of the display area, and configured to perform crack detection on a peripheral edge of the display panel, wherein the peripheral crack detection line includes a third detection line and a fourth detection line, the third detection line is connected with the input line portion, and the fourth detection line is connected with the output line portion; and at least one of the third detection line and the fourth detection line is connected with the crack detection pins.

In some embodiments of the present disclosure, one end of the third detection line is connected with one crack detection pin, and the other end of the third detection line is connected with the input line portion; and one end of the fourth detection line is connected with the output line portion, and the other end of the fourth detection line is connected with another crack detection pin.

In some embodiments of the present disclosure, an area where the crack detection pins are located is a first area of the peripheral area, an area opposite to the first area is a second area of the peripheral area, and areas located on two sides of the first area and the second area are a third area and a fourth area respectively.

One end of the third detection line is connected with one crack detection pin, the other end of the third detection line is connected with the input line portion, and the third detection line extends along the third area by starting from a position connected with the crack detection pin and ending at a position connected with the input line portion.

One end of the fourth detection line is connected with another crack detection pin, the other end of the fourth detection line is connected with the output line portion, and the fourth detection line extends along the fourth area by starting from a position connected with the output line portion and ending at a position connected with the crack detection pin.

In some embodiments of the present disclosure, an area where the crack detection pins are located is a first area of the peripheral area, an area opposite to the first area is a second area of the peripheral area, and areas located on two sides of the first area and the second area are a third area and a fourth area respectively.

One end of the third detection line is connected with one crack detection pin, the other end of the third detection line is connected with the input line portion, and the third detection line extends along the third area by starting from a position connected with the crack detection pins and ending at a position connected with the input line portion.

The fourth detection line includes a first portion, a second portion and a third portion; the first portion, the second portion and the third portion are sequentially connected, and the first portion, the second portion and the third portion do not intersect with each other.

One end of the first portion is connected with the output line portion, and the other end of the first portion is connected with one end of the second portion; the other end of the second portion is connected with one end of the third portion; the other end of the third portion is connected with another crack detection pin; the first portion extends along the third area by starting from a position connected with the output line portion and ending at a position connected with the second portion; the second portion extends along the first area by starting from a position connected with the first portion and ending at a position connected with the third portion; and the third portion extends along the fourth area and turns back to another crack detection pin by starting from the position connected with the second portion and ending at another crack detection pin.

In some embodiments of the present disclosure, the display area includes:
 a plurality of pixel units, distributed in an array into a plurality of pixel unit columns; and
 a plurality of data signal lines, extending in a direction of the pixel unit columns, one data signal line being connected with one pixel unit column.

The peripheral crack detection line includes a first peripheral crack detection line, the first peripheral crack detection line is connected with the through hole crack detection line, and the first peripheral crack detection line includes a third detection line and a fourth detection line.

One end of the third detection line is connected with one crack detection pin, and the other end of the third detection line is connected with the input line portion; and one end of the fourth detection line is connected with the output line portion, and the other end of the fourth detection line is connected with at least one data signal line.

In some embodiments of the present disclosure, an area where the crack detection pins are located is a first area of the peripheral area, an area opposite to the first area is a second area of the peripheral area, and areas located on two sides of the first area and the second area are a third area and a fourth area respectively.

The third detection line includes a fourth portion and a fifth portion, the fourth portion and the fifth portion are connected to each other, and the fourth portion and the fifth portion do not intersect with each other.

One end of the fourth portion is connected with one crack detection pin, the other end of the fourth portion is connected with one end of the fifth portion, and the other end of the fifth portion is connected with the input line portion.

The fourth portion extends from the first area to the second area along the third area, and then turns back from the second area to the first area by starting from a position connected with the crack detection pin and ending at a position connected with the fifth portion; and the fifth portion extends from the first area to the second area along the third area by starting from a position connected with the fourth portion and ending at a position connected with the input line portion.

One end of the fourth detection line is connected with the output line portion, the other end of the fourth detection line is connected with at least one data signal line, and the fourth detection line extends from the second area to the first area along the third area by starting from a position connected with the output line portion and ending at a position connected with the data signal line.

The peripheral crack detection line further includes a second peripheral crack detection line, one end of the second peripheral crack detection line is connected with another crack detection pin, and the other end of the second peripheral crack detection line is connected with at least one data signal line.

The second peripheral crack detection line extends from the first area to the second area along the fourth area, and then turns back from the second area to the first area by starting from a position connected with another crack detection pin and ending at a position connected with the at least one data signal line.

In some embodiments of the present disclosure, the input line portion and the output line portion extend from one side of the first blocking dam close to the through hole to the second area of the peripheral area.

A portion where the input line portion and the output line portion are in the display area are arranged on the same layer as the second touch control electrode layer.

The second touch control electrode layer includes a metal mesh pattern forming a plurality of touch control electrodes, and an orthographic projection of the metal mesh pattern in the display area does not overlap with orthographic projections of the input line portion and the output line portion in the display area.

A second aspect of embodiments of the present disclosure provides a display apparatus, including any of the display panel above.

BRIEF DESCRIPTION OF FIGURES

In order to illustrate technical solutions of the embodiments of the present disclosure more clearly, accompanying drawings needing to be used in the embodiments of the present disclosure will be introduced below briefly. Apparently, the accompanying drawings introduced below are only some embodiments of the present disclosure, those skilled in the art can further obtain other accompanying drawings according to these accompanying drawings without inventive efforts.

DETAILED DESCRIPTION

Figure 1:
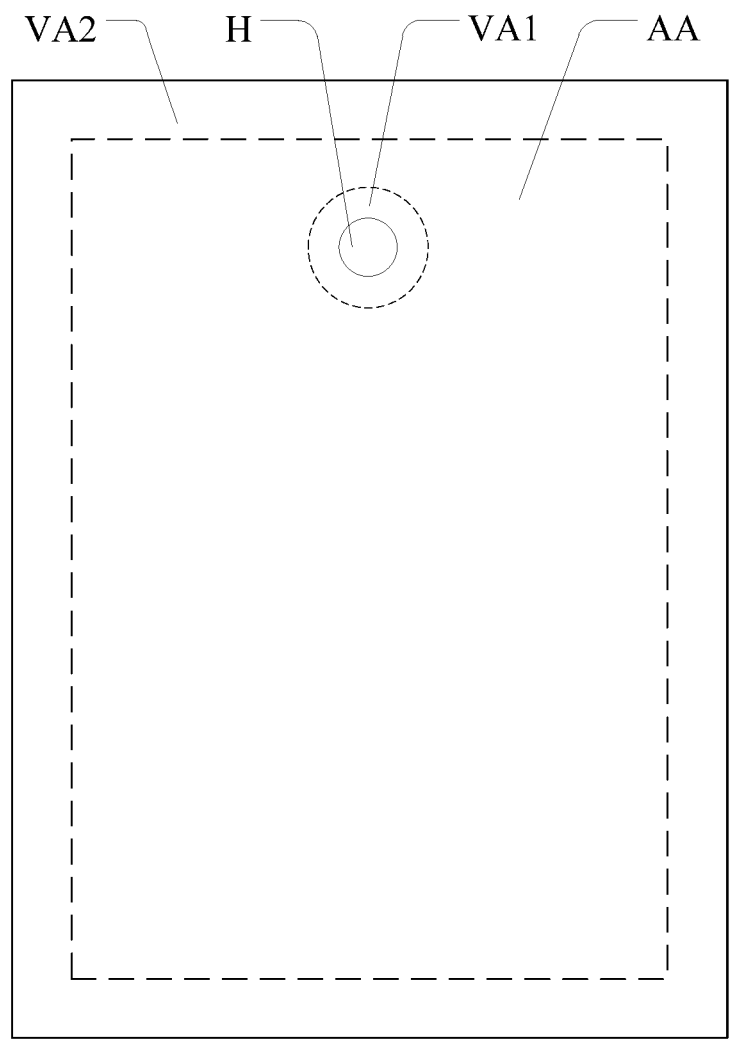
FIG. 1 is a first schematic diagram of a plane structure of a display panel provided by an embodiment of the present disclosure.

In order to make the above objects, features and advantages of the present disclosure more clearly understood, the present disclosure will be further described below with reference to accompanying drawings and embodiments. However, exemplary implementations may be implemented in various forms and should not be construed as being limited to the implementations set forth herein; rather, these implementations are provided so that the present disclosure will be more thorough and complete, and the concept of the exemplary implementations is fully conveyed to those skilled in the art. The same reference numerals in the accompanying drawings denote the same or similar structures, and thus their repeated descriptions will be omitted. The words expressing position and direction described in the present disclosure are all described by taking the accompanying drawings as an example, but changes may also be made as required, and the made changes are all contained in the protection scope of the present disclosure. The accompanying drawings of the present disclosure are only used to illustrate a relative positional relationship and do not represent actual scales.

With the continuous development of display technology, in order to pursue a larger screen-to-body ratio and even achieve a full screen, it is usually necessary to punch a hole in a display area of a display panel to arrange camera components or photosensitive elements, thereby preventing pixel components or photosensitive elements from occupying a side area of the display screen and achieving the larger screen-to-body ratio.

Because the display panel usually uses a rigid substrate such as a glass substrate as a substrate, cracks may occur at an edge of the glass substrate when punching the hole in the display panel. If the cracks extend to the display area, it may cause circuit disconnection and poor display.

To avoid the above problems, a crack detection line is usually set at an edge of a punched hole to detect whether the cracks occur.

FIG. 1 is a first schematic diagram of a plane structure of a display panel provided by an embodiment of the present disclosure.

Referring to FIG. 1, the display panel includes: a display area AA, used for image displaying. The display area AA surrounds at least one through hole H. The through hole H penetrates through the display panel and is used for arranging a camera, a photosensitive element, an optical detection component, and other devices at a position of the through hole H, so as to realize full screen display.

The display panel further includes an isolation area VA1 between the display area AA and the through hole H, and further includes a peripheral area VA2 at a periphery of the display area AA. After punching a hole in a screen of the display panel, cracks may occur at a hole punching position. In order to prevent the above cracks from entering the display area AA and affecting the image displaying, a blocking component is arranged in the isolation area VA1.

Figure 2:
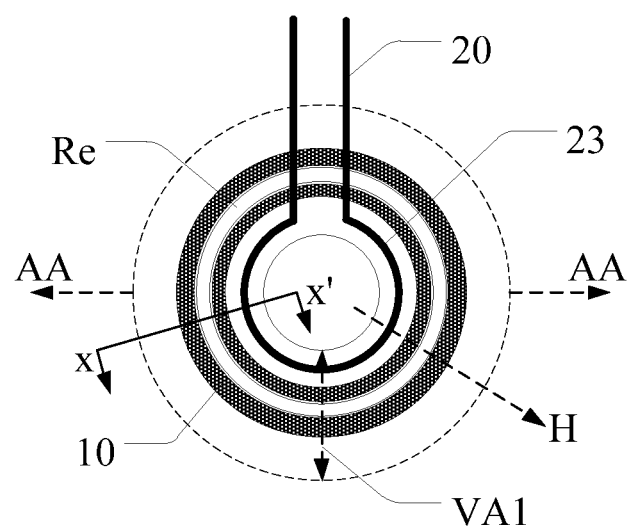
FIG. 2 is a first schematic diagram of a plane structure of a through hole position provided by an embodiment of the present disclosure.

FIG. 2 is a first schematic diagram of a plane structure of a through hole position provided by an embodiment of the present disclosure.

Referring to FIG. 2, the isolation area VA1 includes at least two annular blocking dams 10. The annular blocking dams 10 all surround the through hole H and are nested with each other. The adjacent annular blocking dams 10 are at a set distance apart.

A through hole crack detection line 20 is arranged around the through hole H, and used for performing crack detection on an edge of the through hole H. As shown in FIG. 2, the through hole crack detection line 20 usually extends from the display area AA into the isolation area VA1, surrounds an edge of through hole H by a circle, and then returns from the isolation area VA1 to the display area AA. If cracks occur in a cutting process at the through hole H, extension of the cracks towards the display area AA will cause the through hole crack detection line 20 to tear, resulting in changes in the electrical parameters of the through hole crack detection line 20. By detecting the electrical parameters of the through hole crack detection line 20, whether cracks occur at a position where the through hole H is located may be determined.

In a manufacturing process of the display panel, both the peripheral area VA2 at an edge of the display panel and the isolation area VA1 at the edge of the through hole are arranged with blocking dams to isolate from the display area AA of the display panel. Arranging the blocking dams may block the cracks from further extending to the display area AA, and may further increase a blocking path for water and oxygen, thereby ensuring the performance of a light-emitting device in the display panel. The annular blocking dams 10 in the isolation area VA1 and the through hole crack detection line 20 are all formed in the manufacturing process of the display panel.

The display panel provided by the embodiments of the present disclosure may be an organic light-emitting diode (OLED) display panel. In the OLED display panel, a light-emitting device serving as a pixel unit is an OLED device.

Figure 3:
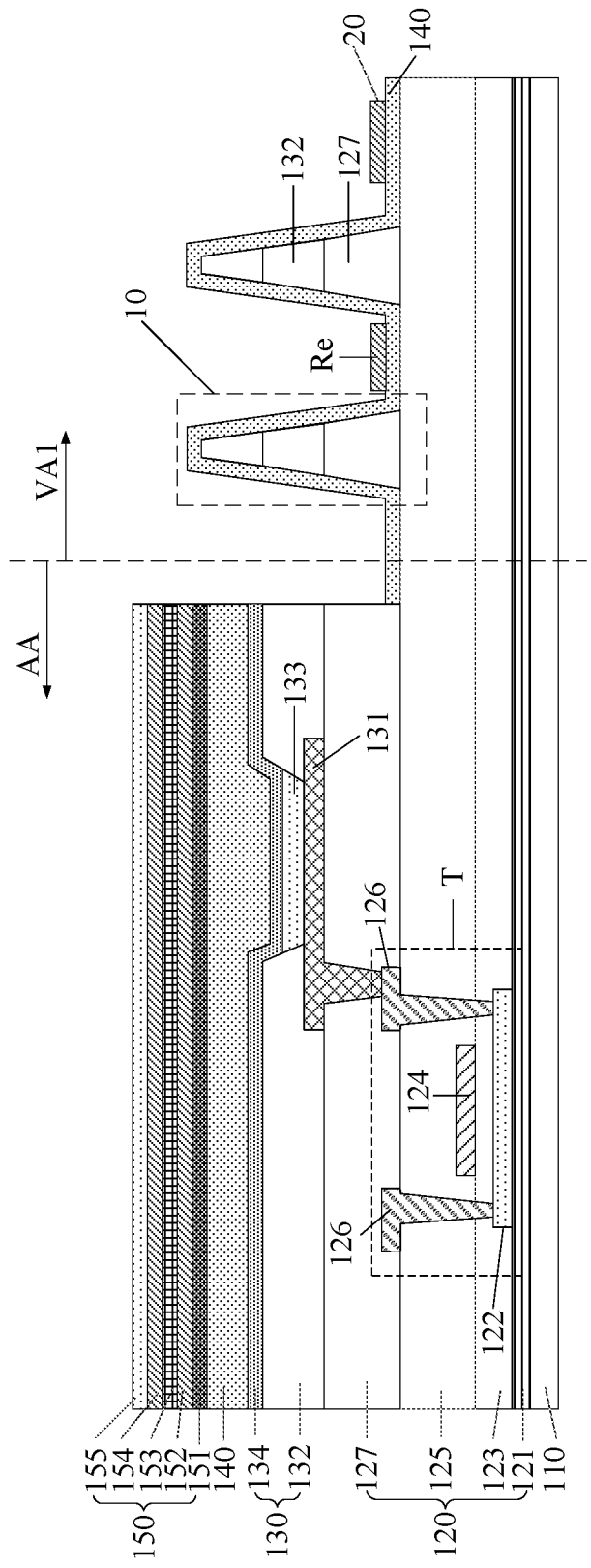
FIG. 3 is a schematic diagram of a cross section structure of a display panel in an x-x' direction in FIG. 2.

FIG. 3 is a schematic diagram of a cross section structure of a display panel in an x-x' direction in FIG. 2.

Referring to FIG. 3, the display panel includes a base substrate 110, a driving circuit layer 120, a light-emitting device layer 130k, an encapsulation layer 140, and a touch control functional layer 150.

The base substrate 110 has functions of supporting and carrying.

The driving circuit layer 120 is located on the base substrate and used for providing a driving signal for a pixel unit.

The light-emitting device layer 130 is located on a side of the driving circuit layer 120 facing away from the base substrate 110. The light-emitting device layer 130 includes a plurality of OLED devices. There is an electrical connection relationship between the OLED devices and the driving circuit layer 120. The light-emitting brightness may be adjusted under driving of the driving signal provided by the driving circuit layer 120.

The encapsulation layer 140 is located on a side of the light-emitting device layer 130 facing away from the base substrate 110. The encapsulation layer 140 has a structure of an inorganic layer and an organic layer which are alternatively stacked, and is used for encapsulating the OLED devices and blocking the water and the oxygen from entering the OLED devices.

The touch control functional layer 150 is located on a side of the encapsulation layer 140 facing away from the light-emitting device layer 130. The touch control functional layer 150 may enable the display panel to achieve a touch control function. Specifically, a metal mesh may be manufactured on a surface of the encapsulation layer 140 to form a touch control structure, without the need for an external touch control board, thereby reducing an overall thickness of the display panel and making it more suitable for a flexible touch control display panel. A touch control display panel manufactured by using this technology does not have a problem of fitting tolerance, which can further reduce a bezel width.

Referring to FIG. 3, the driving circuit layer 120 includes a buffer layer 121, an active layer 122, a gate insulating layer 123, a gate metal layer 124, an interlayer insulating layer 125, a source-drain metal layer 126, and a planarization layer 127.

The buffer layer 121 is located on the base substrate 110. The buffer layer 121 may match a stress between the base substrate 110 and upper film layer(s) and may also improve sealing performance of the display panel. The buffer layer 121 may be made by an inorganic material, which is not limited here.

The active layer 122 is located on a side of the buffer layer 121 facing away from the base substrate 110. The active layer 122 is a functional film layer for forming an active area of a thin film transistor (TFT). The active layer 122 is provided with a preset pattern. The active layer 122 includes a source area and a drain area formed by doping N-type ions or P-type ions. An area between the source area and the drain area is an undoped channel area.

The gate insulating layer 123 is located on a side of the active layer 122 facing away from the buffer layer 121. The gate insulating layer 123 is used for insulating a metal layer above the active layer 122. A material of the gate insulating layer 123 may be silicon oxide, silicon nitride or the like, which is not limited here.

The gate metal layer 124 is located on a side of the gate insulating layer 123 facing away from the active layer 122. The gate metal layer 124 is provided with a pattern including a gate electrode and a scanning signal line. The gate metal layer 124 may adopt a lamination structure of single-layer or multi-layer metal, which is not limited here.

The interlayer insulating layer 125 is located on a side of the gate metal layer 124 facing away from the gate insulating layer 123. The interlayer insulating layer 125 is used for insulating a metal layer above the gate metal layer 124. A material of the interlayer insulating layer 125 may be silicon oxide, silicon nitride or the like, which is not limited here.

The source-drain metal layer 126 is located on a side of the interlayer insulating layer 125 facing away from the gate metal layer 124. The source-drain metal layer 126 is provided with a pattern including a source electrode, a drain electrode and a data signal line. The source-drain metal layer 126 may adopt a lamination structure of single-layer or multi-layer metal, which is not limited here.

The channel area of the active layer, the gate electrode, the source electrode and the drain electrode constitute a thin film transistor T structure.

The planarization layer 127 is located on a side of the source-drain metal layer 126 facing away from the interlayer insulating layer 125. The planarization layer 127 is used for insulating the source-drain metal layer 126, and further flatting a surface of the film layer, which is beneficial to forming other devices on the planarization layer 127. The planarization layer 127 may be made by materials such as organic resin, silicon oxide and silicon nitride, which is not limited here. A surface of the planarization layer 127 is provided with a via hole exposing the drain electrode.

After the above driving circuit layer 120 is formed on the base substrate 110, the light-emitting device layer 130 is formed on the driving circuit layer 120.

Referring to FIG. 3, the light-emitting device layer 130 includes a first electrode layer 131, a pixel defining layer 132, a supporting portion, a light-emitting layer 133, and a second electrode layer 134.

The first electrode layer 131 is located on a side of the planarization layer 127 facing away from the source-drain metal layer 126. The first electrode layer 131 includes a plurality of mutually discrete first electrodes. Each first electrode is electrically connected with the drain electrode of the lower thin film transistor T through a via hole of the planarization layer 127, so that a driving signal is transmitted to the first electrode. A material of the first electrode layer 131 may be a transparent conductive material such as indium tin oxide, which is not limited here.

The pixel defining layer 132 is located on a side of the planarization layer 127 facing away from the source-drain metal layer 126 and located at a spacing position between the first electrodes. The pixel defining layer 132 is used for separating areas where the first electrodes are located. In the manufacturing process, there will be an overlapping area with a small width between the pixel defining layer 132 and edges of the first electrodes. The pixel defining layer 132 has a larger thickness compared to the first electrode layer 131 and other organic functional film layers.

The supporting portion (not shown in the figure) is located on a side of the pixel defining layer 132 facing away from the planarization layer 127. The supporting portion is used for supporting other components in the upper portion of the display panel.

The light-emitting layer 133 is located on a side of the first electrode layer 131 facing away from the planarization layer 127. The light-emitting layers 133 formed on the different first electrodes may adopt the same or different materials. The light-emitting layer 133 may adopt organic light-emitting materials that emit different colors, and the light-emitting layer that emits the different colors is only formed on the corresponding first electrode; or, the light-emitting layer 133 may also adopt an organic light-emitting material that emits white light, the light-emitting layer is arranged in the whole layer, and then a color film substrate is arranged to realize the emission of light rays of the different colors.

The second electrode layer 134 is located on a side of the light-emitting layer 133, the pixel defining layer 132, and the supporting portion facing away from the planarization layer 127. The second electrode layer 134 is arranged in the whole layer, and a material of the second electrode layer 134 may be a conductive material such as metallic silver, which is not limited here.

When a voltage is applied to the first electrode layer 131 and the second electrode layer 134, holes and electrons are compounded into excitons in the light-emitting layer 133 to excite the light-emitting material in the light-emitting layer 133 to emit the light.

After forming the light-emitting device layer 130 on the driving circuit layer 120, the encapsulation layer 140 is formed on a surface of the light-emitting device layer 130. Encapsulation layers closest to and farthest from the light-emitting device layer 130 may be inorganic layers, which can play a role in blocking the water and the oxygen from entering the light-emitting device layer 130. Adding an organic layer between the adjacent two inorganic layers can alleviate stress.

After forming the encapsulation layer 140, the touch control functional layer 150 is formed on the encapsulation layer 140.

Referring to FIG. 3, the touch control functional layer 150 includes a touch control blocking layer 151 located on a surface of a side of the encapsulation layer 140 facing away from the light-emitting device layer 130. The touch control blocking layer 151 plays a role in blocking between the light-emitting device layer and a touch control electrode. The touch control blocking layer 151 may be made by an inorganic material, which is not limited here.

In addition, the touch control functional layer 150 further includes a first touch control electrode layer 152, a touch control insulating layer 153, and a second touch control electrode layer 154.

The first touch control electrode layer 152 is located on a surface of a side of the touch control blocking layer 151 facing away from the encapsulation layer 140. The touch control insulating layer 153 is located on a surface of a side of the first touch control electrode layer 152 facing away from the touch control blocking layer 151. The second touch control electrode layer 154 is located on a surface of a side of the touch control insulating layer 153 facing away from the first touch control electrode layer 152. The first touch control electrode layer 152 and the second touch control electrode layer 154 are metal layers used for achieving the touch control function, and are provided with a metal mesh like pattern. The touch control insulating layer 153 is used between the two metal layers for insulation.

A protection layer 155 is located on a surface of a side of the second touch control electrode layer 154 facing away from the touch control insulating layer 153. The protection layer 155 plays a role in insulated protection of the touch control electrode. The protection layer may be made by an organic material, which is not limited here.

The above is the basic structure of the display panel provided by the embodiments of the present disclosure. The annular blocking dams 10 located in the isolation area VA1 are formed by mutual stacking of materials of the plurality of film layers in the display panel. As shown in FIG. 3, the annular blocking dams 10 may be set up by sharing at least one film layer in the planarization layer 127, the pixel defining layer 132, and the supporting portion. In a process of manufacturing the driving circuit layer 120 and the light-emitting device layer 130 of the display panel, the annular blocking dams 10 are formed using the same patterning process as at least one layer in the planarization layer 127, the pixel defining layer 132, and the supporting portion.

The through hole crack detection line 20 is arranged on the same layer as the metal layer of the touch control functional layer 150 when forming the touch control functional layer 150. Because the touch control functional layer 150 is manufactured after the formation of the driving circuit layer 120 and the light-emitting device layer 130, the through hole crack detection line 20 is manufactured after the annular blocking dams 10 are manufactured. The annular blocking dams 10 have a larger height, so a depth between the adjacent annular blocking dams 10 is larger. The metal layer between the annular blocking dams 10 needs to be etched during manufacturing the touch control functional layer. However, due to a lager depth between the annular blocking dams 10, photoresist covering the metal layer cannot be fully exposed, resulting in the residual metal layer between the annular blocking dams 10. For details, please refer to residual metal Re in FIG. 2 and FIG. 3. In this case, the through hole crack detection line 20 may be electrically connected with the residual metal Re between the annular blocking dams 10, resulting in short circuiting of the through hole crack detection line 20 during signal detection and failure to perform crack detection.

In view of this, the through hole crack detection line 20 in the embodiments of the present disclosure is manufactured using two layers of metal in the touch control functional layer 150 together. In such a case, the metal layer(s) between the adjacent annular blocking dams 10 does/do not need to be etched. The problem of short circuiting of the through hole crack detection line 20 can be avoided and the process difficulty is simplified.

Figure 4:
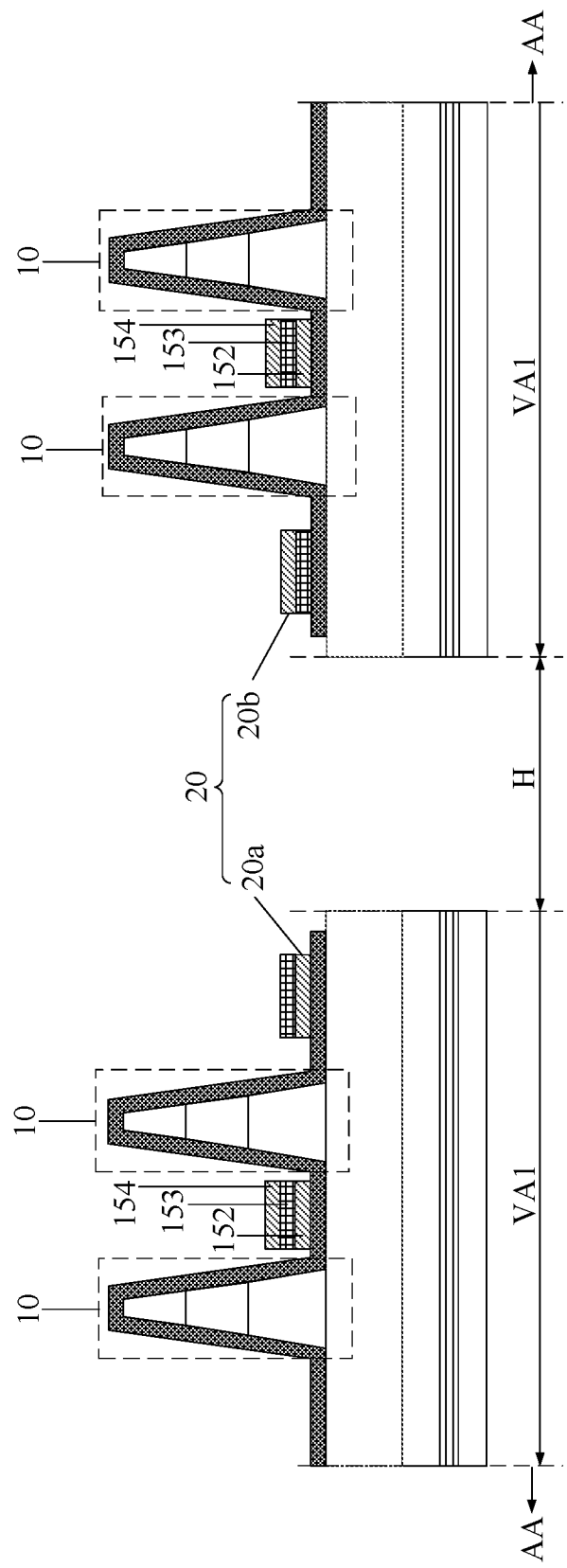
FIG. 4 is a schematic diagram of a cross section structure of a through hole position provided by an embodiment of the present disclosure.

FIG. 4 is a schematic diagram of a cross section structure of a through hole position provided by an embodiment of the present disclosure.

Referring to FIG. 4, two metal layers are arranged between the annular blocking dams 10, namely a first metal layer and a second metal layer, and an insulating layer is further arranged between the two metal layers. During implementations, the first metal layer and the first touch control electrode layer 152 may be arranged on the same layer, and the second metal layer and the second touch control electrode layer 154 may be arranged on the same layer; or, the first metal layer and the second touch control electrode layer 154 may be arranged on the same layer, the second metal layer and the first touch control electrode layer 152 may be arranged on the same layer; and the insulating layer and the touch control insulating layer 153 may be arranged on the same layer. Therefore, when forming the first touch control electrode layer 152, the touch control insulating layer 153, and the second touch control electrode layer 154, the corresponding film layers between the annular blocking dams 10 may be left without etching, thereby retaining the first touch control electrode layer 152 and the second touch control electrode layer 154 between the annular blocking dams 10. Therefore, under a premise of not increasing the process difficulty, the first metal layer, the insulating layer, and the second metal layer are arranged between the adjacent annular blocking dams 10. This process shares the same process as the display panel in manufacturing the touch control functional layer, without increasing a separate process flow, thereby ensuring process consistency.

Figure 5:
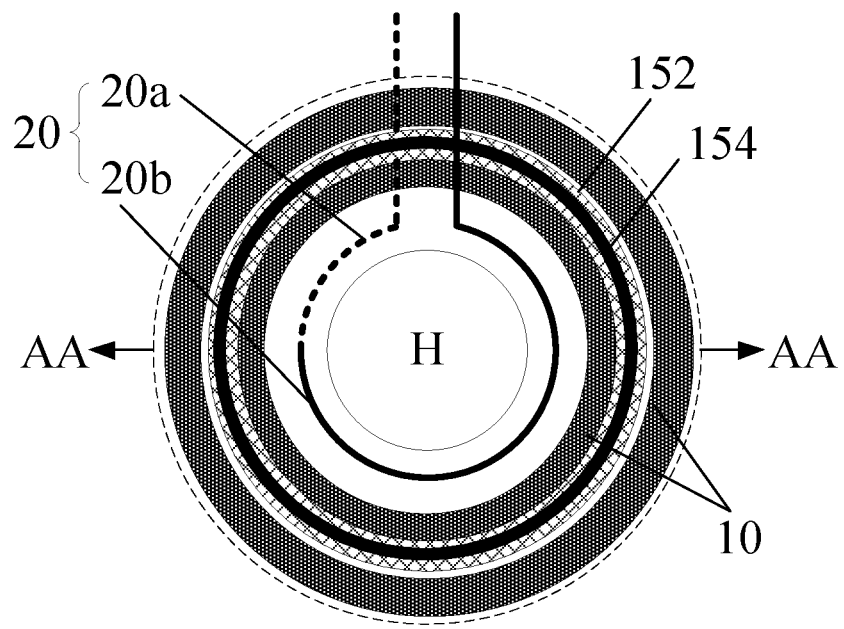
FIG. 5 is a second schematic diagram of a plane structure of a through hole position provided by an embodiment of the present disclosure.

FIG. 5 is a second schematic diagram of a plane structure of a through hole position provided by an embodiment of the present disclosure.

Referring to FIG. 4 and FIG. 5, the embodiments of the present disclosure divide the through hole crack detection line 20 into a first detection line 20a and a second detection line 20b. The first detection line 20a and the first metal layer (the first touch control electrode layer 152 or the second touch control electrode layer 154) are arranged on the same layer and are electrically connected to each other, and the second detection line 20b and the second metal layer (i.e., the second touch control electrode layer 154 or the first touch control electrode layer 152) are arranged on the same layer and are electrically connected to each other. The first detection line 20a and the second detection line 20b are electrically connected, by means of a via hole of the insulating layer (i.e., the touch control insulating layer 153), to each other at a set position.

Patterns of the first touch control electrode layer 152, the touch control insulating layer 153 and the second touch control electrode layer 154 are retained between the annular blocking dams 10. Further, the two metal layers, namely the first touch control electrode layer 152 and the second touch control electrode layer 154, are used to manufacture the through hole crack detection line 20. Due to the touch control insulating layer 153 separating the first touch control electrode layer 152 and the second touch control electrode layer 154 from each other, the through hole crack detection line 20 will not cause a problem of short circuiting when entering and penetrating out of an area of an edge of the through hole, thereby ensuring the detection effectiveness of the through hole crack detection line.

In addition, because the first metal layer, the insulating layer and the second metal layer are arranged between the adjacent annular blocking dams, a thickness of the film layers between the annular blocking dams may be increased, such that mismatch between bottoms of the annular blocking dams and highest positions of the annular blocking dams is reduced. Therefore, in the process that the through hole crack detection line enters and penetrates out of the through hole, the risk of open circuit caused by excessive mismatch and climbing too high may also be reduced when passing through the annular blocking dams.

Figure 6:
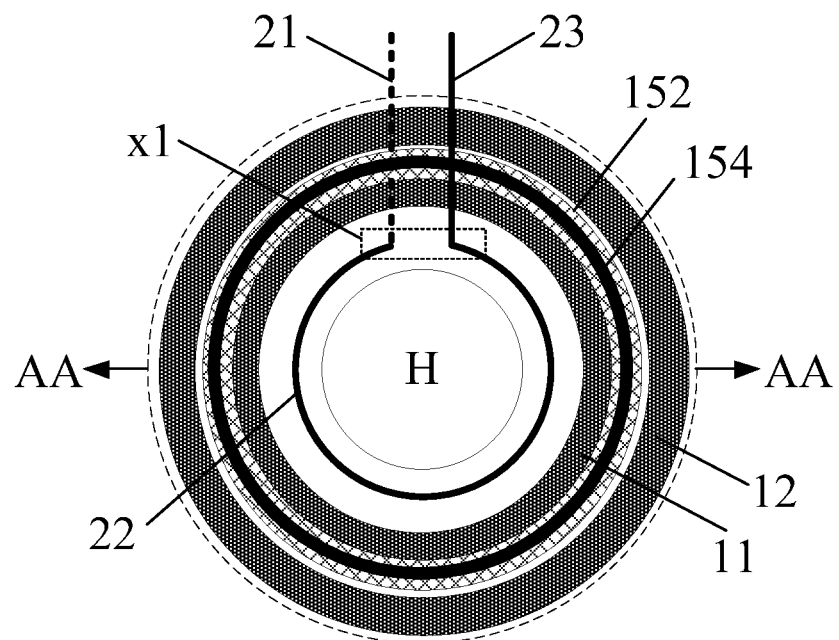
FIG. 6 is a third schematic diagram of a plane structure of a through hole position provided by an embodiment of the present disclosure.
Figure 7:
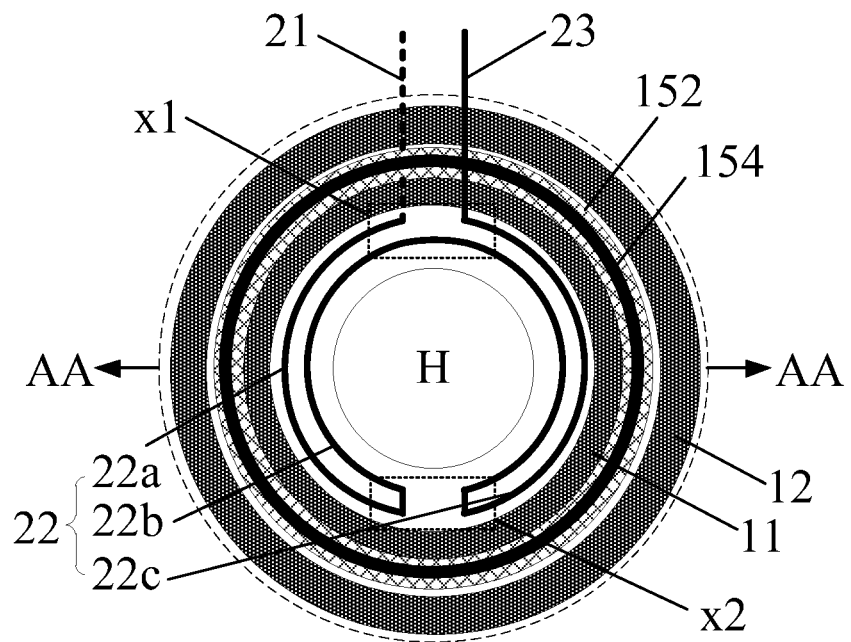
FIG. 7 is a fourth schematic diagram of a plane structure of a through hole position provided by an embodiment of the present disclosure.

FIG. 6 is a third schematic diagram of a plane structure of a through hole position provided by an embodiment of the present disclosure. FIG. 7 is a fourth schematic diagram of the plane structure of the through hole position provided by an embodiment of the present disclosure.

For the convenience of explanation, the embodiments of the present disclosure make illustration by taking an example of arranging two nested annular blocking dams around the through hole H. The annular blocking dam close to the through hole H is a first annular blocking dam 11, and the annular blocking dam located between the first annular blocking dam 11 and a display area AA is a second annular blocking dam 12.

Referring to FIG. 6 and FIG. 7, during implementations, the through hole crack detection line includes an input line portion 21, a winding line portion 22, and an output line portion 23. The input line portion 21 and the output line portion 23 extend from the display area AA to a side of the annular blocking dam 11 close to the through hole H. One end of the winding line portion 22 is connected with the input line portion 21, and the other end of the winding line portion 22 is connected with the output line portion 23. The winding line portion 22 is arranged around the through hole H by starting from a position connected with the input line portion 21 and ending at a position connected with the output line portion 23.

The input line portion 21 and the output line portion 23 are both electrically connected with an external circuit. The input line portion 21 may input a detection signal to the winding portion 22, and the output line portion 23 may transmit out the signal detected by the winding line portion 22. When punching a hole in the display panel to form the through hole H, cracks occurring in any position of through hole H can be detected by the through hole crack detection line 20.

In some embodiments, as shown in FIG. 6, the input line portion 21 and the output line portion 23 are located at the same end of the through hole. For example, the input line portion 21 and the output line portion 23 may be located at a first end x1 of the through hole H shown in FIG. 6. The input line portion 21 and the output line portion 23 are at a set distance apart, and the winding line portion 22 extends one circle around the through hole H.

In order to simplify the design of the through hole crack detection line 20, the input line portion 21 and the output line portion 23 may be arranged at the same end of the through hole H. Usually, the input line portion 21 and the output line portion 23 may be arranged on a side of the through hole H closest to the peripheral area, which can facilitate the leading-out of the input line portion 21 and the output line portion 23. One end of the winding line portion 22 is connected with the input line portion 21, and the other end of the winding line portion 22 is connected with the output line portion 23, such that the winding line portion may surround the through hole H one circle. If cracks occur at the edge of the through hole H at any position, it will cause a change in electrical properties of the winding line portion 22, such as making the winding line portion 22 disconnected, such that whether cracks occur at the edge of the through hole H may be detected by detecting the change in the electrical parameters of the through hole crack detection line 20.

In some embodiments, as shown in FIG. 7, the input line portion 21 and the output line portion 23 are located at the same end of the through hole H. For example, the input line portion 21 and the output line portion 23 may be located at a first end x1 of the through hole H shown in FIG. 7, and the input line portion 21 and the output line portion 23 are at a set distance apart.

As shown in FIG. 7, an end where the input line portion 21 and the output line portion 23 are located is the first end x1 of the through hole, and an end opposite to the first end x1 is a second end x2 of the through hole. The winding line portion 22 includes a first sub portion 22a, a second sub portion 22b and a third sub portion 22c. The first sub portion 22a, the second sub portion 22b and the third sub portion 22c are sequentially connected. The first sub portion 22a, the second sub portion 22b and the third sub portion 22c do not intersect with each other. The first sub portion 22a extends half a circle around the through hole H by starting from a position connected with the input line portion 21 and ending at the second end x2. The third sub portion 22c extends half a circle around the through hole H by starting from a position connected with the output line portion 23 and ending at the second end x2. The second sub portion 22b extends one circle around the through hole H by starting from a position connected with the first sub portion 22a and ending at a position connected with the third sub portion 22c.

The first end x1 is usually a side of the through hole H closest to the peripheral area. The input line portion 21 and the output line portion 23 are arranged at the first end x1 to facilitate leading out to the peripheral area. Arranging the winding line portion 22 as the first sub portion 22a, the second sub portion 22b, and the third sub portion 22c which are sequentially connected is to make the winding line portion 22 continuously surround the through hole H for two circles. In this way, the detection precision of the through hole crack detection line may be improved while allowing the winding line portion 22 to detect the edge of the through hole.

The through hole crack detection line 20 in the embodiments of the present disclosure is manufactured through two metal layers, namely, the first touch control electrode layer 152 and the second touch control electrode layer 154. The parts of the crack detection line 20 that are manufactured through which layer of metal can be set in various forms. The following illustration takes an example of the setting form where the winding line portion 22 surrounds the through hole H for one circle. During implementations, the number of times the winding line portion 22 surrounds the through hole H may be set according to actual needs, which is not limited here.

Figure 8:
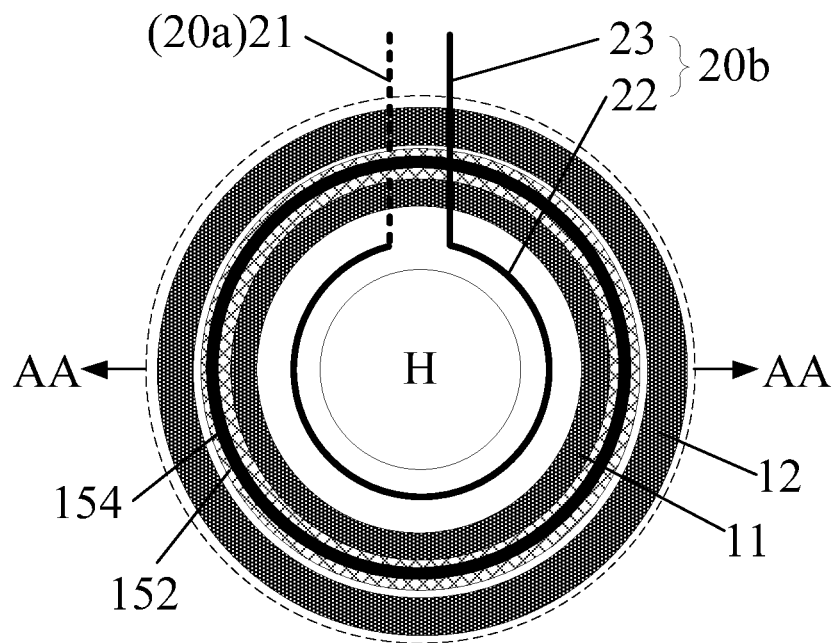
FIG. 8 is a fifth schematic diagram of a plane structure of a through hole position provided by an embodiment of the present disclosure.
Figure 9:
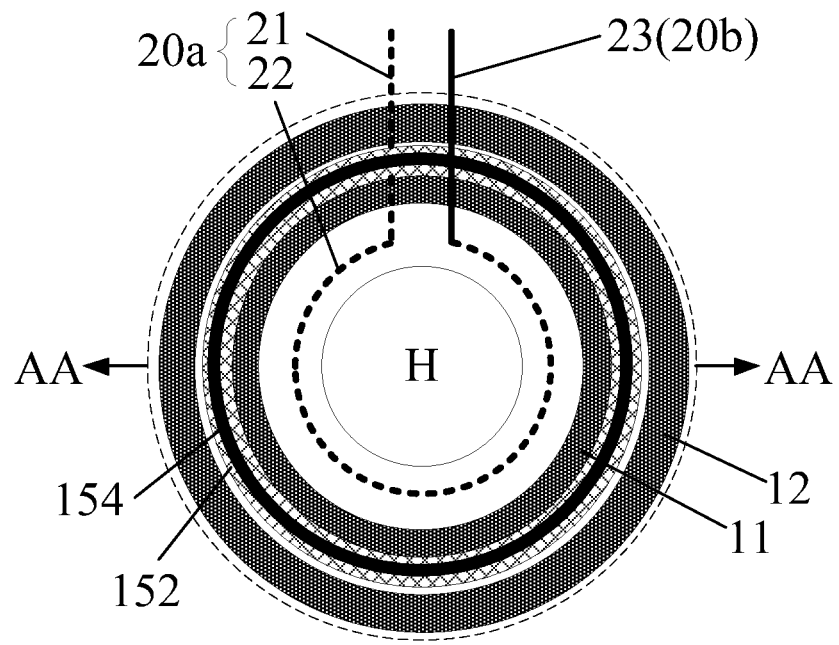
FIG. 9 is a sixth schematic diagram of a plane structure of a through hole position provided by an embodiment of the present disclosure.

FIG. 8 is a fifth schematic diagram of a plane structure of a through hole position provided by an embodiment of the present disclosure. FIG. 9 is a sixth schematic diagram of the plane structure of the through hole position provided by an embodiment of the present disclosure. In FIG. 8 and FIG. 9, a dashed line is used to represent a first detection line 20a, and a solid line is used to represent a second detection line 20b.

Referring to FIG. 8, in some embodiments, the first detection line 20a includes an input line portion 21, and the second detection line 20b includes a winding line portion 22 and an output line portion 23. The winding line portion 22 is connected with the input line portion 21 through a via hole of the insulating layer (i.e., the touch control insulating layer, not shown in the figure).

Referring to FIG. 9, in some embodiments, the first detection line 20a includes an input line portion 21 and a winding line portion 22, and the second detection line 20b includes an output line portion 23. The winding line portion 22 is connected with the output line portion 23 through a via hole of the insulating layer (i.e., a touch control insulating layer, not shown in the figure).

In the implementations shown in FIG. 8 and FIG. 9, the input line portion 21 and the output line portion 23 are located on different metal layers, so even if the distance between the two metal layers is small, it will not cause short circuiting between the two metal layers. When forming the input line portion 21 and the output line portion 23, the input line portion 21 and the output line portion 23 may be patterned together with the corresponding metal layers between a first annular blocking dam 11 and a second annular blocking dam 12, to form an electrical connection relationship. The winding line portion 22 switches layers at an endpoint position, which simplifies the patterning design by using only one layer of metal from the first touch control electrode layer 152 or the second touch control electrode layer 154 during patterning of the winding line portion 22.

The first detection line 20a and the first touch control electrode layer 152 may be arranged on the same layer, and the second detection line 20b and the second touch control electrode layer 154 may be arranged on the same layer; or, the first detection line 20a and the second touch control electrode layer 154 may be arranged on the same layer, and the second detection line 20b and the first touch control electrode layer 152 may be arranged on the same layer, which is not limited here. The winding line portion 22 may usually be arranged in a metal layer that is prone to crack, which can effectively detect cracks. In practical applications, the smaller the thickness of the metal layer, the more prone it is to crack, and an inorganic layer is also more prone to generating cracks compared to an organic layer. Therefore, when arranging the winding line portion 22, it is possible to consider which layer of metal is adjacent to an inorganic film layer and which layer of metal has a smaller thickness, so that the winding line portion 22 may be arranged in this metal layer.

During implementations, the touch control blocking layer 151 and the touch control insulating layer 153 are usually made by an inorganic material, while the protection layer 155 is usually made by an organic material. It can be seen that both sides of the first touch control electrode layer 152 are the inorganic film layers, while the second touch control electrode layer 154 has only one side adjacent to the inorganic film layer. In addition, the thickness of the first touch control electrode layer 152 is also smaller than the thickness of the second touch control electrode layer 154. Therefore, the winding line portion 22 may be arranged in the first touch control electrode layer 152.

Figure 10:
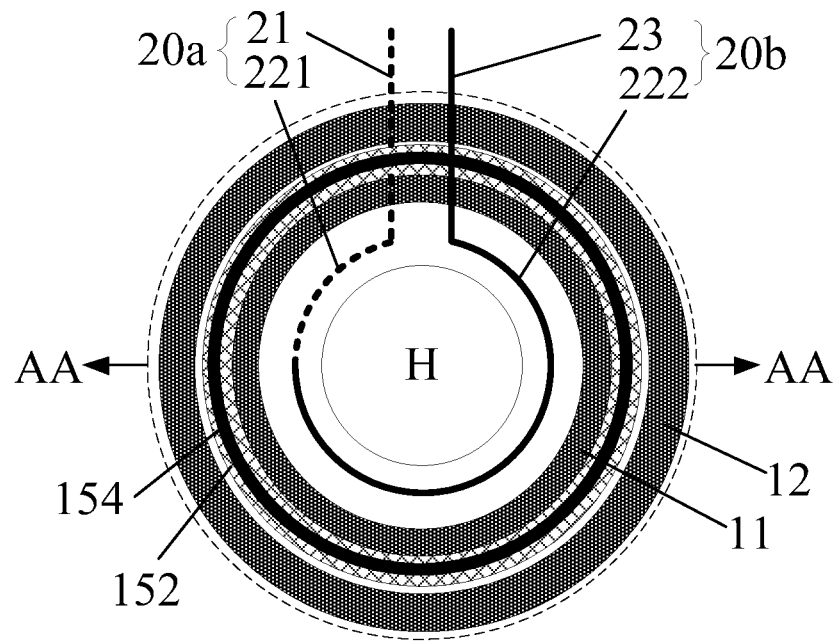
FIG. 10 is a seventh schematic diagram of a plane structure of a through hole position provided by an embodiment of the present disclosure.

FIG. 10 is a seventh schematic diagram of a plane structure of a through hole position provided by an embodiment of the present disclosure. In FIG. 10, a dashed line is used to represent a first detection line 20a, and a solid line is used to represent a second detection line 20b.

Referring to FIG. 10, in some embodiments, a winding line portion consists of a first winding line portion 221 and a second winding line portion 222. The first detection line 20a includes an input line portion 21 and the first winding line portion 221, and the second detection line 20b includes an output line portion 23 and the second winding line portion 222. One end of the first winding line portion 221 is connected with the input line portion 21, and the other end of the first winding line portion is connected with one end of the second winding line portion 222 through a via hole of an insulating layer (i.e., a touch control insulating layer, not shown in the figure). The other end of the second winding line portion 222 is connected with the output line portion 23.

As shown in FIG. 10, the input line portion 21 and the output line portion 23 are still located in different metal layers. Unlike the implementations shown in FIG. 8 and FIG. 9, the winding line portion 22 shown in FIG. 10 no longer switches layers at the endpoint position, but the winding line portion is divided into two parts, namely the first winding line portion 221 and the second winding line portion 222, and the first winding line portion 221 and the second winding line portion 222 may switch the layers at any position other than the endpoint of the winding line portion, which does not require analyzing which layer of metal is more prone to crack. When either layer of metal cracks, it can be detected.

Figure 11:
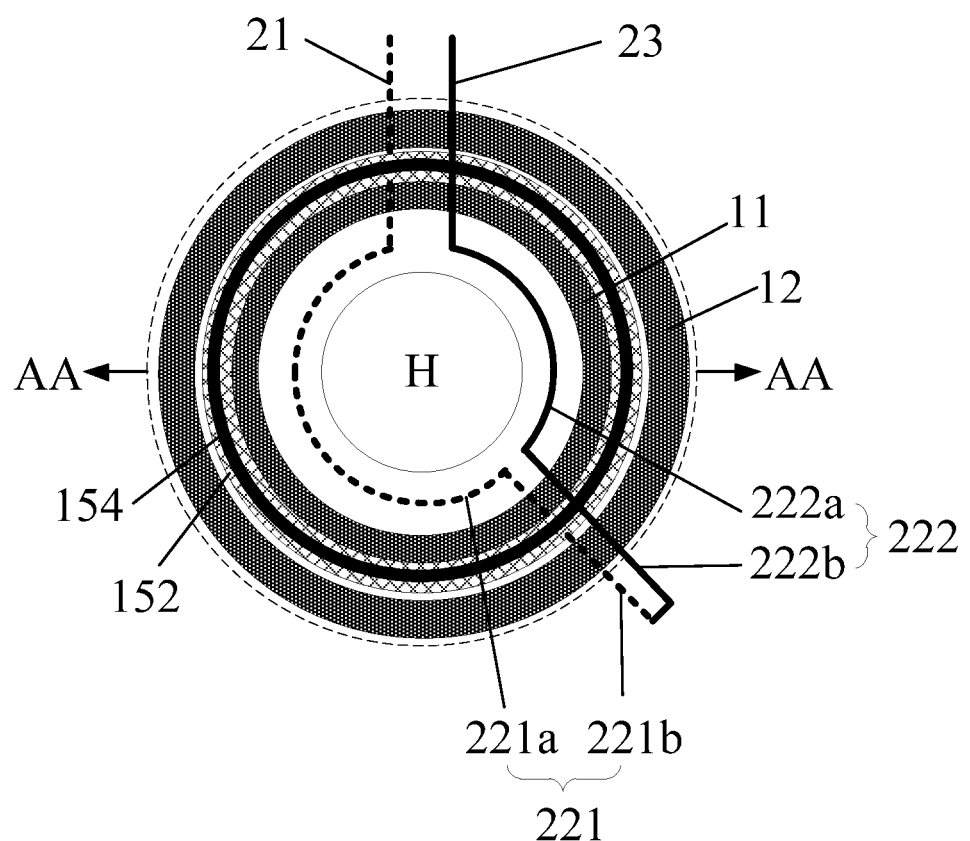
FIG. 11 is an eighth schematic diagram of a plane structure of a through hole position provided by an embodiment of the present disclosure.

FIG. 11 is an eighth schematic diagram of a plane structure of a through hole position provided by an embodiment of the present disclosure. In FIG. 11, a dashed line is used to represent a first detection line, and a solid line is used to represent a second detection line.

Referring to FIG. 11, in some embodiments, the first winding line portion 221 includes a first wiring portion 221a and a first connecting portion 221b. The second winding line portion 222 includes a second wiring portion 222a and a second connecting portion 222b. The first wiring portion 221a and the second wiring portion 222a are located on a side of a first blocking dam 11 close to the through hole H, and are arranged around the through hole. The first connecting portion 221b and the second connecting portion 222b extend to a display area AA from the side of the first blocking dam 11 close to the through hole H. One end of the first connecting portion 221b is connected with the first wiring portion 221a, and the other end of the first connecting portion is connected with one end of the second connecting portion 222b through the via hole of the insulating layer (i.e., a touch control insulating layer, not shown in the figure). The other end of the second connecting portion 222b is connected with the second wiring portion 222a. An orthographic projection of the first connecting portion 221b in the display area AA and an orthographic projection of the second connecting portion 222b in the display area AA have an overlapping area.

It should be noted that when forming the encapsulation layer 140, the encapsulation layer 140 is at least composed of two inorganic layers and one organic layer. The organic layer is located between the two inorganic layers and has a larger thickness. In a process of forming the encapsulation layer 140, the organic layer is usually not formed between the annular blocking dams. In this way, when punching at the position of the through hole, the organic layer on a punched channel is exposed to form a water vapor channel. The annular blocking dams may block the water vapor channel, thus avoiding water vapor from entering the display area along the organic layer and affecting the performance of an OLED device. However, the organic layer has a larger thickness, usually reaching 10 μm. The thickness difference will affect the exposure precision. Therefore, in order to achieve higher exposure precision, in the embodiments of the present disclosure, a connection position of the first winding line portion 221 and the second winding line portion 222 is arranged in the display area AA. For example, the first connecting portion 221b of the first winding line portion 221 extends from the interior of the first annular blocking dam 11 to the display area AA, and the second connecting portion 222b of the second winding line portion 222 extends from the interior of the first annular blocking dam 11 to the display area AA. Exposure is performed in the display area AA to form a via hole for the first connecting portion 221b and the second connecting portion 222b, so that the first connecting portion 221b and the second connecting portion 222b come into contact and form an electrical connection relationship.

Figure 12:
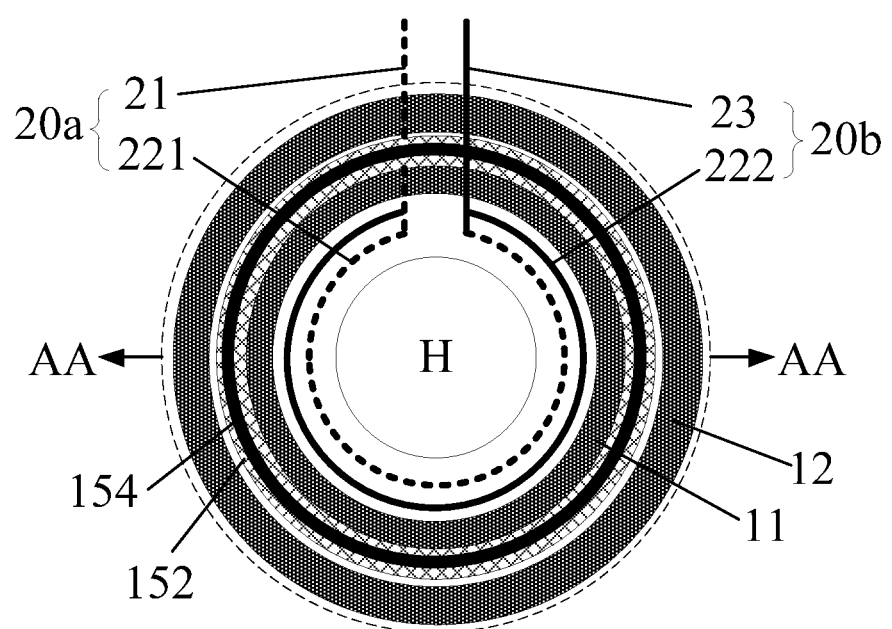
FIG. 12 is a ninth schematic diagram of a plane structure of a through hole position provided by an embodiment of the present disclosure.

FIG. 12 is a ninth schematic diagram of a plane structure of a through hole position provided by an embodiment of the present disclosure. In FIG. 12, a dashed line is used to represent a first detection line 20a, and a solid line is used to represent a second detection line 20b.

Referring to FIG. 12, in some embodiments, two winding line portions are arranged at an edge position of a through hole H, namely, a first winding line portion 221 and a second winding line portion 222. The first detection line 20a includes an input line portion 21 and the first winding line portion 221, and the second detection line 20b includes an output line portion 23 and the second winding line portion 222. The input line portion 21 and the output line portion 23 extend from the display area AA to a side of a first annular blocking dam 11 close to the through hole H. One end of the first winding line portion 221 is connected with the input line portion 21, and the other end of the first winding line portion 221 is connected with the output line portion 23 through a via hole of an insulating layer (i.e., a touch control insulating layer, not shown in the figure). The first winding line portion 221 is arranged around the through hole H by starting from a position connected with the input line portion 21 and ending at a position connected with the output line portion 23. One end of the second winding line portion 222 is connected with the input line portion 21 through a via hole of the insulating layer (i.e., the touch control insulating layer, not shown in the figure), and the other end of the second winding line portion 222 is connected with the output line portion 23. The second winding line portion 222 is arranged around the through hole H by starting from a position connected with the input line portion 21 and ending at a position connected with the output line portion 23.

The input line portion 21 and the output line portion 23 are still located on the different metal layers. The first winding line portion 221 and the second winding line portion 222 with the same connection relationship are arranged, so as to form a parallel relationship between the first winding line portion 221 and the second winding line portion 222. According to a principle of a reduced resistance in a parallel relationship, when one layer of the first winding line portion 221 and the second winding line portion 222 cracks, a loop resistance increases; and when both layers crack, a loop is in an open circuit state with an infinite resistance value. Therefore, any crack occurring in one or two layers can be detected. If one of the first winding line portion 221 and the second winding line portion 222 is in a disconnected state in a processing process, the other may still work normally.

A crack detection method of the display panel provided by embodiments of the present disclosure is illustrated below.

Figure 13:
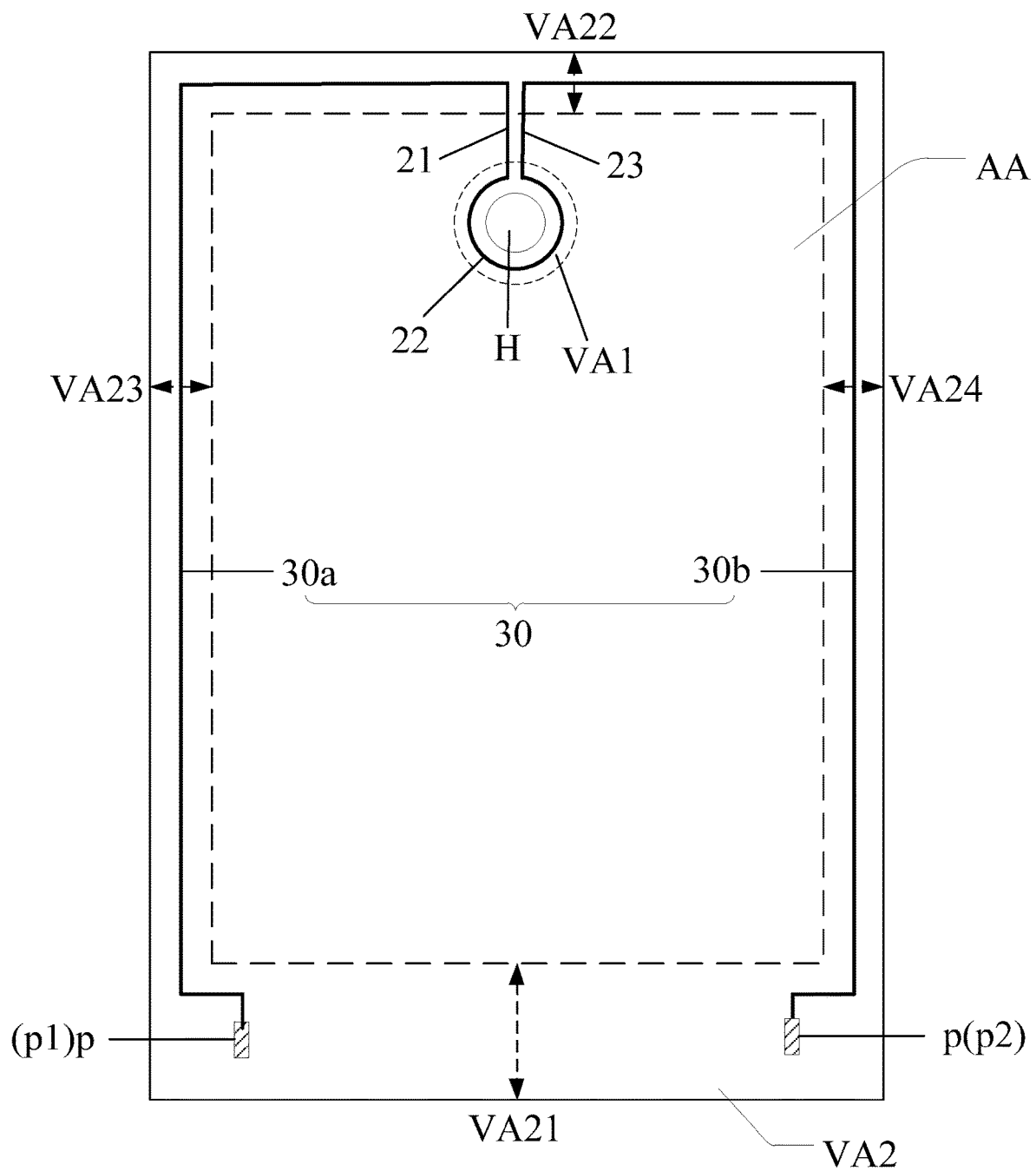
FIG. 13 is a second schematic diagram of a plane structure of a display panel provided by an embodiment of the present disclosure.

FIG. 13 is a second schematic diagram of a plane structure of a display panel provided by an embodiment of the present disclosure.

Referring to FIG. 13, a non-display area of the display panel includes an isolation area VA1 and a peripheral area VA2. Punching a hole in the isolation area VA1 may cause cracks. Similarly, the display panel is also cut from a mother board, so cracks may also occur at an edge of the peripheral area VA2.

Embodiments of the present disclosure have the ability to detect cracks that may occur at various positions on the display panel. As shown in FIG. 13, the peripheral area VA2 may be divided into a first area VA21, a second area VA22, a third area VA23, and a fourth area VA24. The first area VA21 is a peripheral area farthest from the through hole H, and a crack detection pin p is arranged in the first area VA21. The second area VA22 is arranged opposite to the first area VA21. The third area VA23 and the fourth area VA24 are located on two sides of the first area VA21 respectively.

In order to detect whether cracks occur at the edge of the display area AA, a peripheral crack detection line 30 is further arranged. The peripheral crack detection line 30 is arranged around the edge of the display area AA. The peripheral crack detection line is configured to perform crack detection on a peripheral edge of the display panel.

As shown in FIG. 13, the peripheral crack detection line 30 includes a third detection line 30a and a fourth detection line 30b. The third detection line 30a is connected with an input line portion 21 of a through hole crack detection line, and the fourth detection line 30b is connected with an output line portion 23 of the through hole crack detection line. At least one of the third detection line 30a and the fourth detection line 30b is connected with the crack detection pin p.

There is an electrical connection relationship between the peripheral crack detection line 30 and the through hole crack detection line, and a detection signal is provided by the crack detection pin p. Therefore, whether the display panel has cracks may be judged by detecting electrical parameters of the peripheral crack detection line 30.

As shown in FIG. 13, two crack detection pins p may be provided, namely a first crack detection pin p1 and a second crack detection pin p2 respectively. One end of the third detection line 30a is connected with the first crack detection pin p1, and the other end of the third detection line 30a is connected with the input line portion 21. One end of the fourth detection line 30b is connected with the output line portion 23, and the other end of the fourth detection line 30b is connected with the second crack detection pin p2.

The peripheral crack detection line 30 and the through hole crack detection line are mutually connected to form a wire that surrounds the edge of the display area and the edge of the through hole H. By detecting a resistance value between the first crack detection pin p1 and the second crack detection pin p2, a resistance value of the wire may be detected. When there are no cracks occurring on the peripheral edge of the display panel and the edge of the through hole, it is detected that a resistance value between the first crack detection pin p1 and the second crack detection pin p2 is the resistance value of the above wire. When there are cracks occurring on the peripheral edge of the display panel and/or the edge of the through hole, the above wire will be disconnected, and the resistance value between the first crack detection pin p1 and the second crack detection pin p2 is infinite.

According to the above principle, when a detection signal is output to the first crack detection pin p1, a feedback signal may be received at the second crack detection pin p2 after the detection signal passes through the above wire. When there are no cracks occurring on the peripheral edge of the display panel and the edge of the through hole, a difference value between the detection signal and the feedback signal is a voltage drop caused by the resistance of the wire. Therefore, when the difference between the feedback signal and the detection signal is within a set threshold range, it may be characterized that there are no cracks occurring on the peripheral edge of the display panel and the edge of the through hole. When there are cracks occurring on the peripheral edge of the display panel and/or the edge of the through hole, the above wire will be disconnected, the second crack detection pin p2 cannot receive the feedback signal, so that the difference between the feedback signal and the detection signal exceeds the threshold range, thus characterizing that there are cracks occurring on the peripheral edge of the display panel and/or the edge of the through hole.

When performing crack detection on the display panel using the principle of resistance detection, the peripheral crack detection line and through hole crack detection line may be arranged in various ways.

In some embodiments, as shown in FIG. 13, one end of the third detection line 30a is connected with the first crack detection pin p1, and the other end of the third detection line 30a is connected with the input line portion 21. The third detection line 30a extends along the third area VA23 by starting from a position connected with the first crack detection pin p1 and ending at a position connected with the input line portion 21. One end of the fourth detection line 30b is connected with the second crack detection pin p2, and the other end of the fourth detection line 30b is connected with the output line portion 23. The fourth detection line 30b extends along the fourth area VA24 by starting from a position connected with the output line portion 23 and ending at a position connected with the second crack detection pin p2.

The third detection line 30a and the fourth detection line 30b in the peripheral crack detection line 30 are located on two sides of the through hole H respectively, and are connected through the through hole crack detection line. The third detection line 30a and the fourth detection line 30b use a single wire design, which can simplify the design and reduce the process difficulty.

Figure 14:
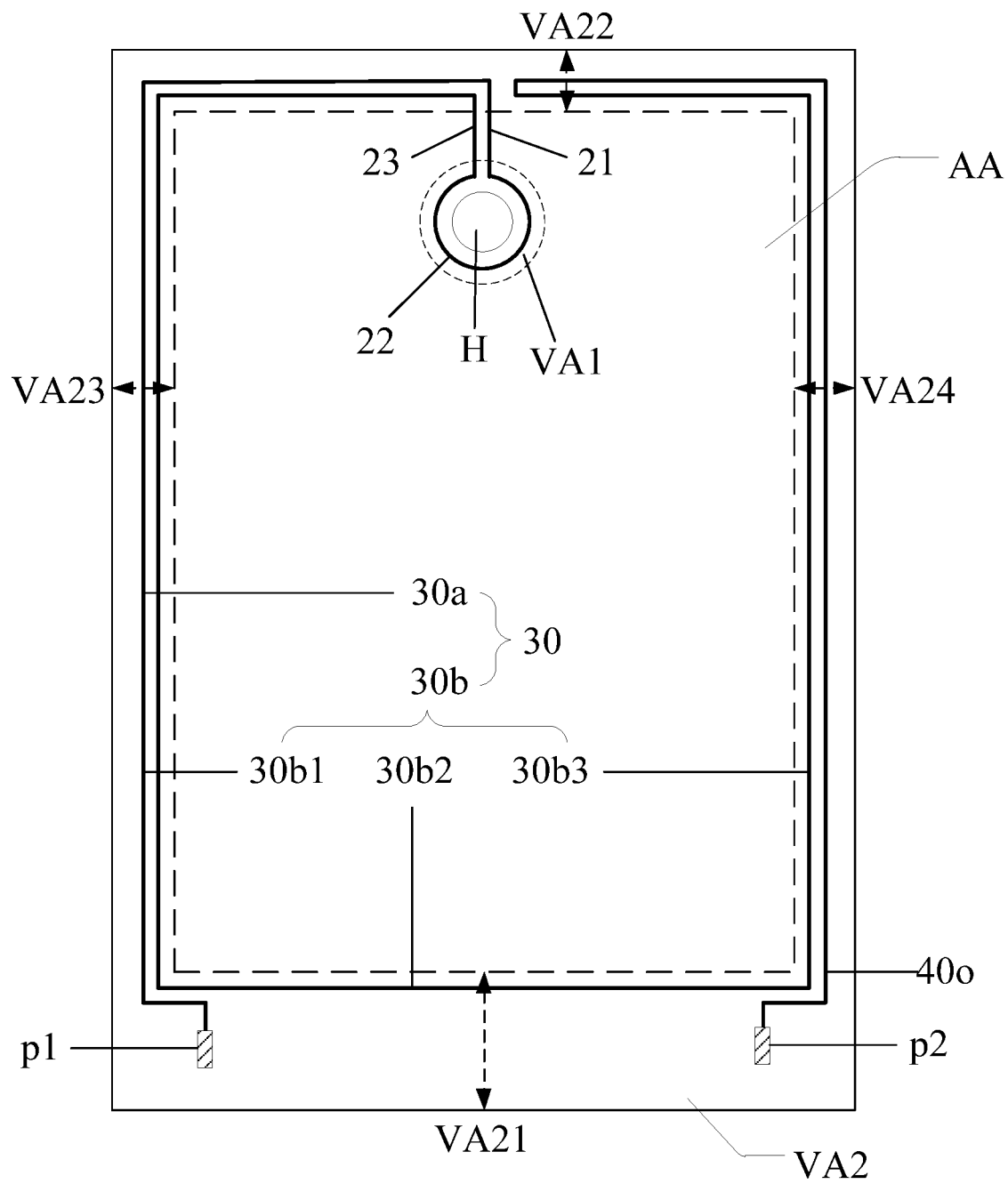
FIG. 14 is a third schematic diagram of a plane structure of a display panel provided by an embodiment of the present disclosure.

FIG. 14 is a third schematic diagram of a plane structure of a display panel provided by an embodiment of the present disclosure.

In some embodiments, as shown in FIG. 14, one end of the third detection line 30a is connected with the first crack detection pin p1, and the other end of the third detection line 30a is connected with the input line portion 21. The third detection line 30a extends along the third area VA23 by starting from a position connected with the first crack detection pin p1 and ending at a position connected with the input line portion 21. The fourth detection line 30b includes a first portion 30b1, a second portion 30b2 and a third portion 30b3. The first portion 30b1, the second portion 30b2 and the third portion 30b3 are sequentially connected and do not intersect with each other. One end of the first portion 30b1 is connected with the output line portion 23, and the other end of the first portion 30b1 is connected with one end of the second portion 30b2. The other end of the second portion 30b2 is connected with one end of the third portion 30b3. The other end of the third portion 30b3 is connected with the second crack detection pin p2. The first portion 30b1 extends along the third area VA23 by starting from a position connected with the output line portion 23 and ending at a position connected with the second portion 30b2. The second portion 30b2 extends along the first area VA21 by starting from a position connected with the first portion 30b1 and ending at a position connected with the third portion 30b3. The third portion 30b3 extends along the fourth area VA24 and turns back to the second crack detection pin p2 by starting from the position connected with the second portion 30b2 and ending at the second crack detection pin p2.

The peripheral crack detection line 30 surrounds the edge of the display panel for two circles by turning back at the edge of the display panel, so that the peripheral crack detection line 30 is arranged in the wider area of the edge of the display panel. Therefore, as long as the cracks extend to the position where the peripheral crack detection line 30 exists, the peripheral crack detection line in at least one position will break. At this point, the occurrence of cracks may be detected by detecting the resistance value between the first crack detection pin p1 and the second crack detection pin p2, thereby improving the precision of crack detection.

During implementations, the number of times the peripheral crack detection line 30 extends around the edge of the display panel may be set according to actual needs, which is not limited here.

Figure 15:
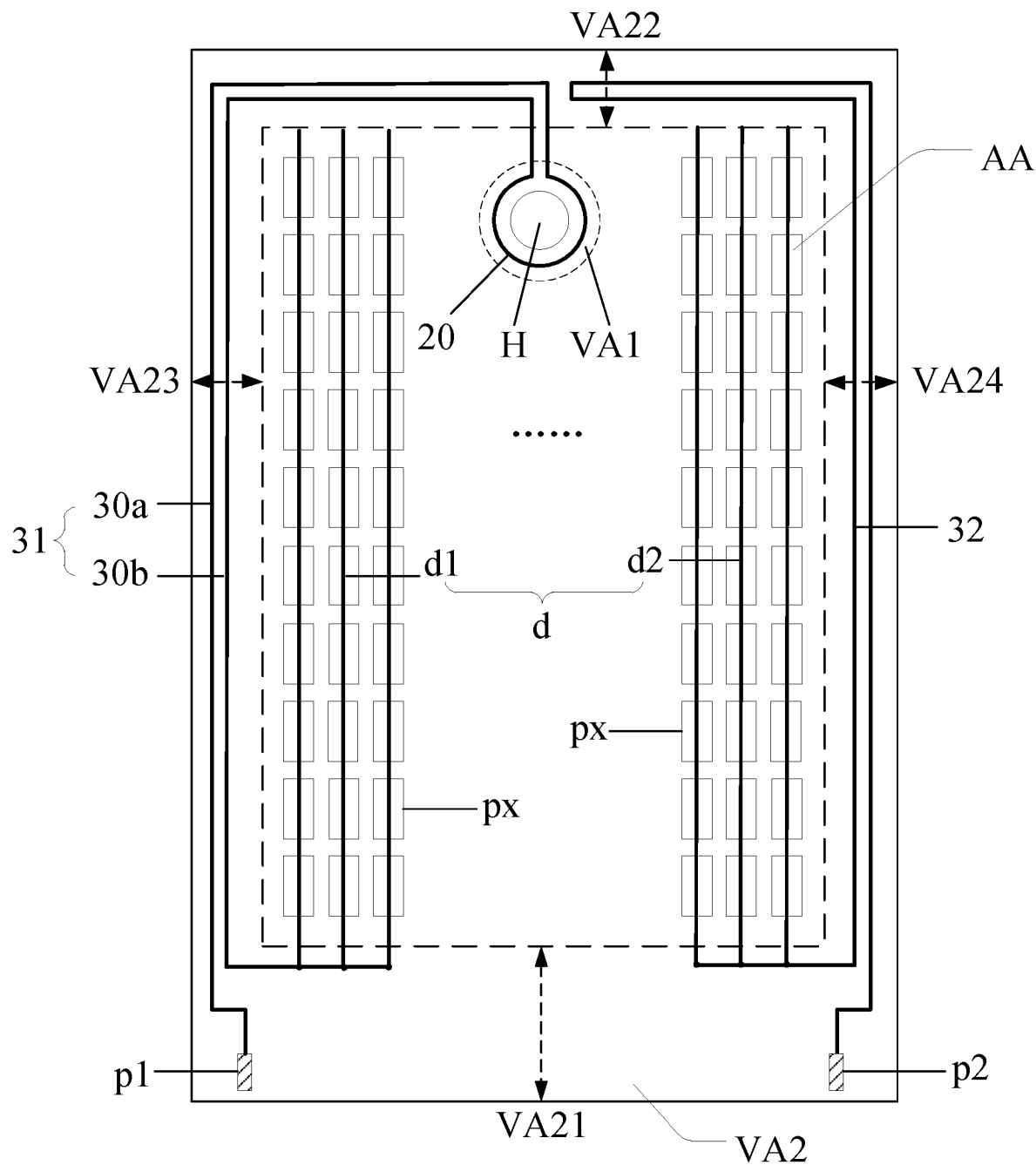
FIG. 15 is a fourth schematic diagram of a plane structure of a display panel provided by an embodiment of the present disclosure.

FIG. 15 is a fourth schematic diagram of a plane structure of a display panel provided by an embodiment of the present disclosure.

Referring to FIG. 15, the display area AA includes: a plurality of pixel units px, distributed in an array into a plurality of pixel unit columns. The display area AA is further provided with a plurality of data signal lines d, extending in a direction of the pixel unit column. One data signal line d is connected with one pixel unit column. The data signal lines d may be divided into a first data signal line d1 and a second data signal line d2.

The peripheral crack detection line 30 includes a first peripheral crack detection line 31 and a second peripheral crack detection line 32. The first peripheral crack detection line 31 is connected with the through hole crack detection line 20. The first peripheral crack detection line 31 includes a third detection line 30a and a fourth detection line 30b. One end of the third detection line 30a is connected with the first crack detection pin p1, and the other end of the third detection line 30a is connected with the input line portion of the through hole crack detection line. One end of the fourth detection line 30b is connected with the output line portion of the through hole crack detection line, and the other end of the fourth detection line 30b is connected with at least one first data signal line d1. One end of the second peripheral crack detection line 32 is connected with the second crack detection pin p2, and the other end of the second peripheral crack detection line 32 is connected with at least one second data signal line d2.

As shown in FIG. 15, the embodiments of the present disclosure divides the peripheral crack detection line 30 into two parts, namely the first peripheral crack detection line 31 and the second peripheral crack detection line 32. The first peripheral crack detection line 31 and the second peripheral crack detection line 32 are located at edges of the two sides of the display panel respectively, and are arranged around the edge of the display panel.

Only the first peripheral crack detection line 31 is connected with the through hole crack detection line 20. A path is formed among the first crack detection pin p1, the first peripheral crack detection line 31, the through hole crack detection line 20 and the first data signal line(s) d1. The first crack detection pin p1 outputs a detection signal, and the detection signal may be the same as a signal that drives the pixel units to light up. If there are no cracks occurring at positions where the first peripheral crack detection line 31 and the through hole crack detection line 20 are located, then brightness of the pixel unit column(s) connected with the first data signal line(s) d1 is no different from brightness of other pixel unit columns. If there are cracks occurring at any position where the first peripheral crack detection line 31 and/or through hole crack detection line 20 are located, the brightness of the pixel unit column(s) connected with the first data signal line(s) d1 is different from the brightness of other pixel unit columns. Therefore, whether the cracks occur on one side of the display panel may be detected by detecting the brightness of the pixel unit column(s) connected with the first data signal line(s) d1.

A path is formed among the second crack detection pin p2, the second peripheral crack detection line 32, and the second data signal line(s) d2. The second crack detection pin p2 outputs a detection signal, and the detection signal may be the same as a signal that drives the pixel units to light up. If there are no cracks occurring at a position where the second peripheral crack detection line 32 is located, then brightness of the pixel unit column(s) connected with the second data signal line(s) d2 is no different from the brightness of other pixel unit columns. If there are cracks occurring at any position where the second peripheral crack detection line 32 is located, the brightness of the pixel unit column(s) connected with the second data signal line(s) d2 is different from the brightness of other pixel unit columns. Therefore, whether the cracks occur on the other side of the display panel may be detected by detecting the brightness of the pixel unit column(s) connected with the second data signal line(s) d2.

Figure 16:
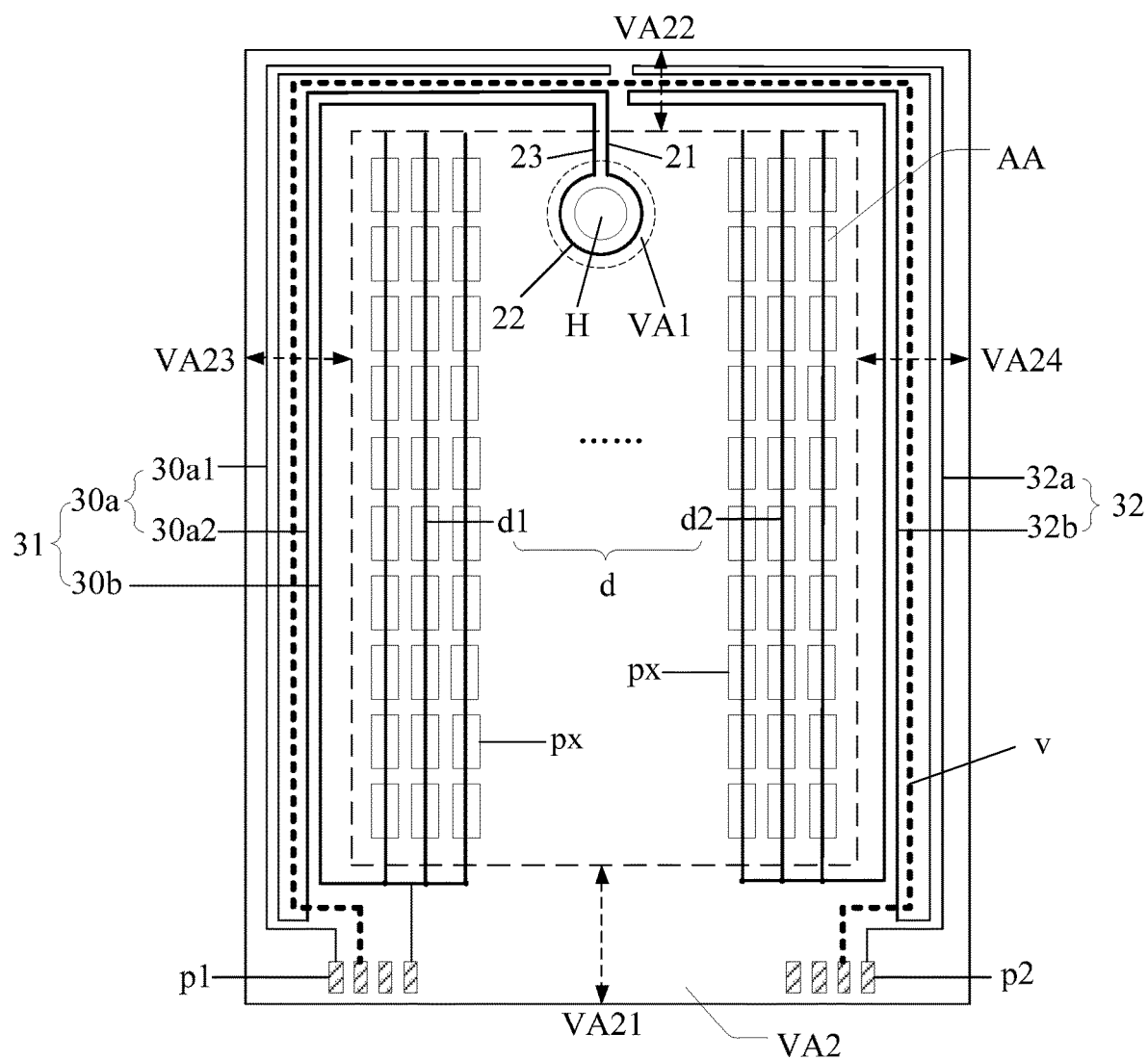
FIG. 16 is a fifth schematic diagram of a plane structure of a display panel provided by an embodiment of the present disclosure.

FIG. 16 is a fifth schematic diagram of a plane structure of a display panel provided by an embodiment of the present disclosure.

Referring to FIG. 16, in some embodiments, for the first peripheral crack detection line 31, the third detection line 30a includes a fourth portion 30a1 and a fifth portion 30a2. The fourth portion 30a1 and the fifth portion 30a2 are connected to each other, and do not intersect with each other. One end of the fourth portion 30a1 is connected with the first crack detection pin p1, and the other end of the fourth portion 30a1 is connected with one end of the fifth portion 30a2. The other end of the fifth portion 30a2 is connected with the input line portion 21. The fourth portion 30a1 extends from the first area VA21 to the second area VA22 along the third area VA23, and then turns back from the second area VA22 to the first area VA21 by starting from a position connected with the first crack detection pin p1 and ending at a position connected with the fifth portion 30a2. The fifth portion 30a2 extends from the first area VA21 to the second area VA22 along the third area VA23 by starting from a position connected with the fourth portion 30a1 and ending at a position connected with the input line portion 21.

One end of the fourth detection line 30b is connected with the output line portion 23, and the other end of the fourth detection line 30b is connected with at least one first data signal line d1. The fourth detection line 30b extends from the second area VA22 to the first area VA21 along the third area VA23 by starting from a position connected with the output line portion 23 and ending at a position connected with the first data signal line d1.

For the second peripheral crack detection line 32, the second peripheral crack detection line 32 includes a sixth portion 32a and a seventh portion 32b. One end of the sixth portion 32a is connected with the second crack detection pin p2, and the other end of the sixth portion is connected with one end of the seventh portion 32b. The other end of the seventh portion 32b is connected with at least one second data signal line d2. The sixth portion 32a extends from the first area VA21 to the second area VA22 along the fourth area VA24, and then turns back from the second area VA22 to the first area VA21 by starting from a position connected with the second crack detection pin p2 and ending at a position connected with the seventh portion 32b. The seventh portion 32b extends from the first area VA21 to the second area VA22 along the fourth area VA24, and then turns back from the second area VA22 to the first area VA21 by starting from a position connected with the sixth portion 32a and ending at a position connected with the second data signal line d2.

As shown in FIG. 16, in the peripheral area VA2 of the display panel, a power signal line v is further arranged around the edge of the display area AA. The power signal line v is used for being connected with a cathode of an OLED panel. Due to the cathode of the OLED panel is arranged as an entire layer, the power signal line v is arranged to surround the display area AA for a circle, and applying a signal to the cathode can improve the voltage drop problem of the cathode.

The first peripheral crack detection line 31 and the second peripheral crack detection line 32 are still located on the two sides of the display panel. The first peripheral crack detection line 31 is connected with the through hole crack detection line. Due to the presence of the power signal line v, the peripheral crack detection line usually needs to be arranged on an outer side of the power signal line v to avoid signal interference between the two lines. In the embodiments of the present disclosure, the first peripheral crack detection line 31 and the second peripheral crack detection line 32 each is divided into two parts, which are arranged on both sides of a corresponding power signal line v. The design of multiple turning-back for the first peripheral crack detection line 31 and the second peripheral crack detection line 32 is beneficial for improving the detection precision.

The through hole crack detection line arranged in the annular blocking dams finally needs to be led out to the edge of the display area AA and connected with the peripheral crack detection line 30, and then connected to the crack detection pins by the peripheral crack detection line 30 to form a path for achieving crack detection. In the embodiments of the present disclosure, when the through hole crack detection line 20 is led out to the display area AA, manufacturing may be performed by sharing the metal layer in the touch control functional layer, but it needs to be disconnected from the metal pattern used for forming the touch control electrode in the touch control functional layer to avoid short circuiting.

Figure 17:
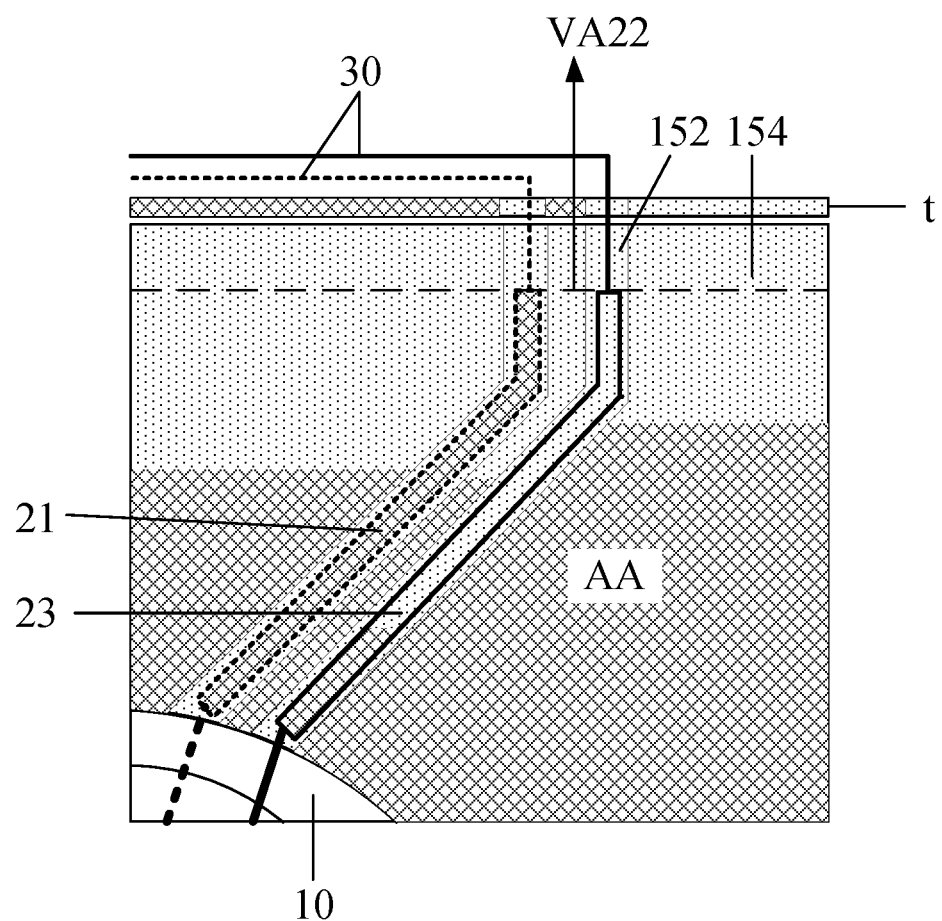
FIG. 17 is a schematic diagram of a local structure of a second area provided by an embodiment of the present disclosure.

FIG. 17 is a schematic diagram of a local structure of a second area provided by an embodiment of the present disclosure.

As shown in FIG. 17, an input line portion 21 and an output line portion 23 of a through hole crack detection line extend from the interior of an annular blocking dam 10 closest to the through hole to the second area VA22 in a peripheral area. A portion of the input line portion 21 and the output line portion 23 in the display area AA are arranged on the same layer as the second touch control electrode layer 154. The second touch control electrode layer 154 is located above the first touch control electrode layer 152. When patterning these two metal layers, the patterning of the second touch control electrode layer is more convenient.

The second touch control electrode layer 154 includes a metal mesh pattern for forming a plurality of touch control electrodes, and thus the portion of the input line portion 21 and the output line portion 23 in the display area AA may also be manufactured in the form of a metal mesh. It is worth noting that the input line portion 21 and the output line portion 23 need to be disconnected from other metal mesh portions in the second touch control electrode layer 154, so that orthographic projections of the metal mesh patterns corresponding to the touch control electrodes in the display area AA do not overlap with orthographic projections of the input line portion 21 and the output line portion 23 in the display area AA.

As shown in FIG. 17, a touch control electrode lead t for connecting the touch control electrodes is further arranged in the peripheral area. The touch control electrode lead t may be manufactured through two metal layers, namely the first touch control electrode layer 152 and the second touch control electrode layer 154, to reduce the resistance of the touch control electrode lead t itself. Because the input line portion 21, the output line portion 23, and the touch control electrode lead t are all manufactured through the metal layer of the second touch control electrode layer 154, short circuiting will be caused if the input line portion 21 and the output line portion 23 pass through the touch control electrode lead t and make contact with the touch control electrode lead t when extending towards the second area VA22 in the peripheral area. In order to avoid the above problems, in the embodiments of the present disclosure, the corresponding second touch control electrode layer is subjected to fracture treatment at a portion of the touch control electrode lead t corresponding to the input line portion 21 and the output line portion 23, so that there is no electrical connection between the input line portion 21 and the output line portion when passing through the touch control electrode lead t.

Based on the same inventive concept, embodiments of the present disclosure further provide a display apparatus including any of the above display panel. Principles of the display apparatus for solving the problems are similar to that of the above display panel, therefore, implementation of the display apparatus may refer to that of the above display panel, and repetitions are omitted.

Although the preferred embodiments of the present disclosure have been described, those skilled in the art can make additional alterations and modifications on these embodiments once they know the basic creative concept. Therefore, the appended claim intends to be explained as including the preferred embodiments and all alterations and modifications falling within the scope of the present disclosure.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A display panel, comprising:
a display area, used for image displaying, and surrounding at least one through hole; and
an isolation area, located between the through hole and the display area surrounding the through hole, wherein the isolation area comprises:
at least two annular blocking dams, wherein the annular blocking dams surround the through hole, and the annular blocking dams are nested; and a first metal layer, an insulating layer, and a second metal layer are arranged in a gap between the adjacent annular blocking dams, and the insulating layer is located between the first metal layer and the second metal layer; and a through hole crack detection line, wound around an edge of the through hole, and configured to perform crack detection on the edge of the through hole, wherein the through hole crack detection line comprises a first detection line and a second detection line, the first detection line is arranged on a layer same as the first metal layer and is electrically connected to the first metal layer, the second detection line is arranged on a layer same as the second metal layer and is electrically connected to the second metal layer, and the first detection line and the second detection line are electrically connected, through a via hole of the insulating layer, to each other at a set position.

2. The display panel according to claim 1, wherein the through hole crack detection line comprises an input line portion, a winding line portion, and an output line portion;

the at least two annular blocking dams comprise a first blocking dam close to the through hole and a second blocking dam between the first blocking dam and the display area;

the input line portion and the output line portion extend from the display area to a side of the first blocking dam close to the through hole; and one end of the winding line portion is connected with the input line portion, and the other end of the winding line portion is connected with the output line portion; and the winding line portion is arranged around the through hole by starting from a position connected with the input line portion and ending at a position connected with the output line portion.

3. The display panel according to claim 2, wherein the input line portion and the output line portion are at a same end of the through hole, the input line portion and the output line portion are spaced at a set distance, and the winding line portion extends one circle around the through hole.

4. The display panel according to claim 2, wherein the input line portion and the output line portion are at a same end of the through hole, the input line portion and the output line portion are spaced at a set distance, the end where the input line portion and the output line portion are located is a first end of the through hole, and an end opposite to the first end is a second end of the through hole;

the winding line portion comprises a first sub portion, a second sub portion and a third sub portion; the first sub portion, the second sub portion and the third sub portion are sequentially connected, and the first sub portion, the second sub portion and the third sub portion do not intersect with each other; and the first sub portion extends half a circle around the through hole by starting from a position connected with the input line portion and ending at the second end; the third sub portion extends half a circle around the through hole by starting from a position connected with the output line portion and ending at the second end; and the second sub portion extends one circle around the through hole by starting from a position connected with the first sub portion and ending at a position connected with the third sub portion.

5. The display panel according to claim 2, wherein the first detection line comprises the input line portion and the winding line portion, and the second detection line comprises the output line portion; and the winding line portion is connected with the output line portion through the via hole of the insulating layer.

6. The display panel according to claim 5, wherein a thickness of the first metal layer is less than a thickness of the second metal layer; and the winding line portion is arranged on a layer same as the first metal layer.

7. The display panel according to claim 2, wherein the first detection line comprises the input line portion, and the second detection line comprises the winding line portion and the output line portion; and the winding line portion is connected with the input line portion through the via hole of the insulating layer.

8. The display panel according to claim 2, wherein the first detection line comprises the input line portion and a first winding line portion, the second detection line comprises the output line portion and a second winding line portion, and the first winding line portion and the second winding line portion constitute the winding line portion; and one end of the first winding line portion is connected with the input line portion, the other end of the first winding line portion is connected with one end of the second winding line portion through the via hole of the insulating layer, and the other end of the second winding line portion is connected with the output line portion.

9. The display panel according to claim 8, wherein the first winding line portion comprises a first wiring portion and a first connecting portion; and the second winding line portion comprises a second wiring portion and a second connecting portion;

the first wiring portion and the second wiring portion are located on a side of the first blocking dam close to the through hole, and are arranged around the through hole;

the first connecting portion and the second connecting portion extend to the display area from the side of the first blocking dam close to the through hole;

one end of the first connecting portion is connected with the first wiring portion, the other end of the first connecting portion is connected with one end of the second connecting portion through the via hole of the insulating layer, and the other end of the second connecting portion is connected with the second wiring portion; and an orthographic projection of the first connecting portion in the display area and an orthographic projection of the second connecting portion in the display area have an overlapping area.

10. The display panel according to claim 2, wherein the first detection line comprises the input line portion and a first winding line portion, and the second detection line comprises the output line portion and a second winding line portion;

the input line portion and the output line portion extend from the display area to a side of the first blocking dam close to the through hole;

one end of the first winding line portion is connected with the input line portion, and the other end of the first winding line portion is connected with the output line portion through the via hole of the insulating layer; and the first winding line portion is arranged around the through hole by starting from a position connected with the input line portion and ending at a position connected with the output line portion; and one end of the second winding line portion is connected with the input line portion through the via hole of the insulating layer, and the other end of the second winding line portion is connected with the output line portion; and the second winding line portion is arranged around the through hole by starting from a position connected with the input line portion and ending at a position connected with the output line portion.

11. The display panel according to claim 2, comprising:
a base substrate;
a driving circuit layer, located on the base substrate;
a light-emitting device layer, located on a side of the driving circuit layer facing away from the base substrate;
an encapsulation layer, located on a side of the light-emitting device layer facing away from the base substrate; and
a touch control functional layer, located on a side of the encapsulation layer facing away from the light-emitting device layer, wherein
the touch control functional layer comprises:
a touch control blocking layer, located on a surface of the side of the encapsulation layer facing away from the light-emitting device layer;
a first touch control electrode layer, located on a surface of a side of the touch control blocking layer facing away from the encapsulation layer;
a touch control insulating layer, at least partially located on a surface of a side of the first touch control electrode layer facing away from the touch control blocking layer;
a second touch control electrode layer, at least partially located on a surface of a side of the touch control insulating layer facing away from the first touch control electrode layer; and
a protection layer, at least partially located on a surface of a side of the second touch control electrode layer facing away from the touch control insulating layer, wherein the first metal layer and the first touch control electrode layer are arranged on a same layer, the second metal layer and the second touch control electrode layer are arranged on a same layer, and the insulating layer and the touch control insulating layer are arranged on a same layer.

12. The display panel according to claim 11, wherein the driving circuit layer comprises:
a buffer layer, located on the base substrate;
an active layer, located on a side of the buffer layer facing away from the base substrate;
a gate insulating layer, located on a side of the active layer facing away from the buffer layer;
a gate metal layer, located on a side of the gate insulating layer facing away from the active layer;
an interlayer insulating layer, located on a side of the gate metal layer facing away from the gate insulating layer;
a source-drain metal layer, located on a side of the interlayer insulating layer facing away from the gate metal layer; and
a planarization layer, located on a side of the source-drain metal layer facing away from the interlayer insulating layer; and
the light-emitting device layer comprises:
a first electrode layer, located on a side of the planarization layer facing away from the source-drain metal layer, and comprising a plurality of mutually discrete first electrodes;
a pixel defining layer, located on the side of the planarization layer facing away from the source-drain metal layer, and at least partially located at a spacing position between the first electrodes;
a supporting portion, located on a side of the pixel defining layer facing away from the planarization layer;
a light-emitting layer, located on a side of the first electrodes facing away from the planarization layer; and
a second electrode layer, located on a side of the light-emitting layer, the pixel defining layer and the supporting portion facing away from the planarization layer, wherein
the annular blocking dams comprise at least one stacked film layer, and the film layer comprised by the annular blocking dams is arranged on a layer same as at least one of the planarization layer, the pixel defining layer, and the supporting portion.

13. The display panel according to claim 11, further comprising: a peripheral area surrounding the display area, wherein the peripheral area comprises:
a crack detection pin, located in the peripheral area on a side of the display area; and
a peripheral crack detection line, arranged around an edge of the display area, and configured to perform crack detection on a peripheral edge of the display panel, wherein the peripheral crack detection line comprises a third detection line and a fourth detection line, the third detection line is connected with the input line portion, and the fourth detection line is connected with the output line portion; and at least one of the third detection line and the fourth detection line is connected with the crack detection pin.

14. The display panel according to claim 13, wherein one end of the third detection line is connected with one crack detection pin, and the other end of the third detection line is connected with the input line portion; and one end of the fourth detection line is connected with the output line portion, and the other end of the fourth detection line is connected with another crack detection pin.

15. The display panel according to claim 14, wherein an area where the crack detection pins are located is a first area of the peripheral area, an area opposite to the first area is a second area of the peripheral area, and areas located on two sides of the first area and the second area are a third area and a fourth area of the peripheral area respectively;
the one end of the third detection line is connected with the one crack detection pin, the other end of the third detection line is connected with the input line portion, and the third detection line extends along the third area by starting from a position connected with the one crack detection pin and ending at a position connected with the input line portion; and
the one end of the fourth detection line is connected with the another crack detection pin, the other end of the fourth detection line is connected with the output line portion, and the fourth detection line extends along the fourth area by starting from a position connected with the output line portion and ending at a position connected with the another crack detection pin.

16. The display panel according to claim 14, wherein an area where the crack detection pins are located is a first area of the peripheral area, an area opposite to the first area is a second area of the peripheral area, and areas located on two sides of the first area and the second area are a third area and a fourth area of the peripheral area respectively;
the one end of the third detection line is connected with the one crack detection pin, the other end of the third detection line is connected with the input line portion, and the third detection line extends along the third area by starting from a position connected with the one crack detection pin and ending at a position connected with the input line portion; and the fourth detection line comprises a first portion, a second portion and a third portion; the first portion, the second portion and the third portion are sequentially connected, and the first portion, the second portion and the third portion do not intersect with each other; and one end of the first portion is connected with the output line portion, and the other end of the first portion is connected with one end of the second portion; the other end of the second portion is connected with one end of the third portion; the other end of the third portion is connected with the another crack detection pin; the first portion extends along the third area by starting from a position connected with the output line portion and ending at a position connected with the second portion; the second portion extends along the first area by starting from a position connected with the first portion and ending at a position connected with the third portion; and the third portion extends along the fourth area and turns back to the another crack detection pin by starting from the position connected with the second portion and ending at the another crack detection pin.

17. The display panel according to claim 13, wherein the display area comprises:
  a plurality of pixel units, distributed in an array into a plurality of pixel unit columns; and
  a plurality of data signal lines, extending in a direction of the pixel unit column, one data signal line being connected with one pixel unit column, wherein
  the peripheral crack detection line comprises a first peripheral crack detection line, the first peripheral crack detection line is connected with the through hole crack detection line, and the first peripheral crack detection line comprises the third detection line and the fourth detection line; and
  one end of the third detection line is connected with one crack detection pin, and the other end of the third detection line is connected with the input line portion; and one end of the fourth detection line is connected with the output line portion, and the other end of the fourth detection line is connected with at least one data signal line.

18. The display panel according to claim 17, wherein an area where the crack detection pins are located is a first area of the peripheral area, an area opposite to the first area is a second area of the peripheral area, and areas located on two sides of the first area and the second area are a third area and a fourth area of the peripheral area respectively;
  the third detection line comprises a fourth portion and a fifth portion, the fourth portion and the fifth portion are connected to each other, and the fourth portion and the fifth portion do not intersect with each other;
  one end of the fourth portion is connected with the one crack detection pin, the other end of the fourth portion is connected with one end of the fifth portion, and the other end of the fifth portion is connected with the input line portion;
  the fourth portion extends from the first area to the second area along the third area, and then turns back from the second area to the first area by starting from a position connected with the one crack detection pin and ending at a position connected with the fifth portion; and the fifth portion extends from the first area to the second area along the third area by starting from a position connected with the fourth portion and ending at a position connected with the input line portion;
  one end of the fourth detection line is connected with the output line portion, the other end of the fourth detection line is connected with at least one data signal line, and the fourth detection line extends from the second area to the first area along the third area by starting from a position connected with the output line portion and ending at a position connected with the data signal line;
  the peripheral crack detection line further comprises a second peripheral crack detection line, one end of the second peripheral crack detection line is connected with another crack detection pin, and the other end of the second peripheral crack detection line is connected with at least one data signal line; and
  the second peripheral crack detection line extends from the first area to the second area along the fourth area, and then turns back from the second area to the first area by starting from a position connected with the another crack detection pin and ending at a position connected with the at least one data signal line.

19. The display panel according to claim 13, wherein the input line portion and the output line portion extend from a side of the first blocking dam close to the through hole to a second area of the peripheral area;
  a portion of the input line portion and the output line portion in the display area are arranged on a layer same as the second touch control electrode layer; and
  the second touch control electrode layer comprises a metal mesh pattern forming a plurality of touch control electrodes, and an orthographic projection of the metal mesh pattern in the display area does not overlap with orthographic projections of the input line portion and the output line portion in the display area.

20. A display apparatus, comprising the display panel according to claim 1.

* * * * *